United States Patent
Miyano

(10) Patent No.: US 6,647,147 B1
(45) Date of Patent: Nov. 11, 2003

(54) METHOD FOR MEASURING FINE PATTERN, APPARATUS FOR MEASURING FINE PATTERN, AND RECORD MEDIUM THAT CAN STORE THEREIN PROGRAM TO MEASURE FINE PATTERN AND CAN BE READ BY USING COMPUTER

(75) Inventor: Yumiko Miyano, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 567 days.

(21) Appl. No.: 09/616,984

(22) Filed: Jul. 14, 2000

(30) Foreign Application Priority Data

Jul. 15, 1999 (JP) ............................................. 11-202038

(51) Int. Cl.⁷ ................................................. G06K 9/48
(52) U.S. Cl. ......................... 382/199; 382/190; 382/256
(58) Field of Search ................................ 382/112, 141, 382/144, 148, 151, 199, 212, 256, 266, 284, 287, 294, 309; 358/504; 716/19–21

(56) References Cited

U.S. PATENT DOCUMENTS

| | | | |
|---|---|---|---|
| 5,723,233 A | * 3/1998 | Garza et al. | 430/5 |
| 5,740,068 A | * 4/1998 | Liebmann et al. | 716/21 |
| 5,815,685 A | 9/1998 | Kamon | 716/21 |
| 5,862,058 A | * 1/1999 | Samuels et al. | 716/21 |
| 6,091,845 A | * 7/2000 | Pierrat et al. | 382/144 |
| 6,183,920 B1 | * 2/2001 | Tsujikawa et al. | 430/30 |
| 6,289,499 B1 | * 9/2001 | Rieger et al. | 716/21 |
| 6,335,981 B1 | * 1/2002 | Harazaki | 382/144 |
| 6,470,489 B1 | * 10/2002 | Chang et al. | 716/21 |

FOREIGN PATENT DOCUMENTS

| | | |
|---|---|---|
| JP | 9-34095 | 2/1997 |
| JP | 10-301257 | 11/1998 |
| JP | 10-301258 | 11/1998 |
| JP | 11-184064 | 7/1999 |
| JP | 11-184071 | 7/1999 |

OTHER PUBLICATIONS

Garofalo, et al "Automatic Proximity Correction for 0.35Tm I–line Photolithography", IEEE, pp. 92–94, 1994.*

* cited by examiner

*Primary Examiner*—Daniel G. Mariam
(74) *Attorney, Agent, or Firm*—Finnegan, Henderson, Farabow, Garrett & Dunner, L.L.P.

(57) ABSTRACT

This at least comprises: a first step of capturing an image of a fine pattern; a second step of extracting a contour of the fine pattern from the image; a third step of capturing a standard figure of the fine pattern; a fourth step of superimposing the standard figure on the contour by enlarging or reducing the standard figure while maintaining an aspect ratio thereof; a fifth step of extracting an intersection of the contour and the standard figure; a sixth step of extracting a differential region surrounded with the contour, the standard figure and the intersection; a seventh step of extracting a correction pattern region from the differential region; and an eighth step of measuring the correction pattern region.

14 Claims, 18 Drawing Sheets

FIG.1A
PRIOR ART
| | BEFORE CORRECTION | AFTER CORRECTION |
|---|---|---|
| RETICLE PATTERN | 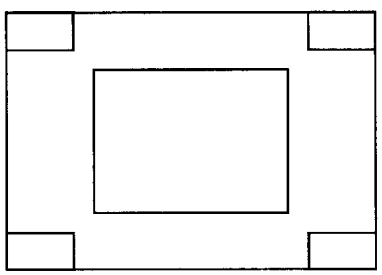 | 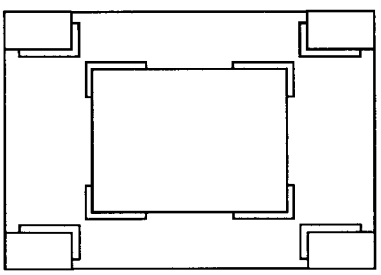 |
| TRANSCRIPTION PATTERN | 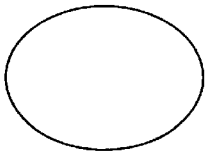 |  |
FIG.1B
PRIOR ART
| | BEFORE CORRECTION | AFTER CORRECTION |
|---|---|---|
| RETICLE PATTERN | 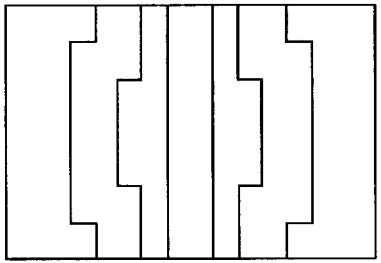 | 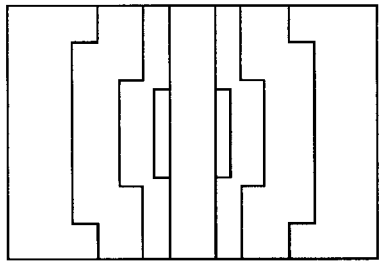 |
| TRANSCRIPTION PATTERN | 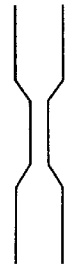 |  |

QUARTZ 13
CHROMIUM 12

STANDARD FIGURE 14
15
CORRECTION PATTERN 15

CONTOUR 16

CORRECTION PATTERN REGION 17
16
17
INTERSECTION 26
STANDARD FIGURE 14
17
17

CONTOUR 19

STANDARD FIGURE 20

CORRECTION PATTERN 21

STANDARD FIGURE 20

CORRECTION PATTERN REGION 25

CONTOUR 16

METHOD FOR MEASURING FINE PATTERN, APPARATUS FOR MEASURING FINE PATTERN, AND RECORD MEDIUM THAT CAN STORE THEREIN PROGRAM TO MEASURE FINE PATTERN AND CAN BE READ BY USING COMPUTER

BACKGROUND OF THE INVENTION

1. Field of the Invention

The present invention relates to a method for measuring a fine pattern, an apparatus for measuring a fine pattern, and a record medium that can store therein a program to measure a fine pattern and can be read by using a computer. More particularly, the present invention relates to an exposing technique in a process for manufacturing a semiconductor device. Moreover, the present invention relates to a method for separate an optical proximity correction pattern from a fine pattern such as a reticle pattern and the like.

2. Description of the Related Art

An exposing technique (lithography technique), which is a basic technique of a micro fabrication used in a process for manufacturing a semiconductor integrated circuit, is a technique for optically transcribing a pattern of a photo mask, such as a reticle and the like, based on a circuit pattern onto a film deposited on a wafer surface. Etching, film deposition, impurity injection or the like is carried out in accordance with the pattern transcribed onto the wafer. The semiconductor integrated circuit is manufactured by the repetition of those operations.

Associated with a hyperfine structure of a pattern dimension of a semiconductor device, an optical proximity effect induced when the reticle pattern is transcribed onto the wafer has large influence on the electrical properties of the semiconductor device.

Actually, as shown in a sketch before a correction on a left column of FIG. 1A, a transcription of a rectangular reticle pattern onto the wafer causes a so called pattern end shortening to be induced, in which a corner portion of the transcription pattern is not transcribed and it is rounded. Also, a transcription of a line pattern as shown in a sketch before a correction on a left column of FIG. 1B results in a dimensional variation (rough and fine dependency) caused by environmental change in a pattern periphery, as the word goes, in which a central portion of a line at a center is thinly transcribed. The optical proximity effect causes the semiconductor device to be largely deviated from a design pattern, which makes a predetermined operation of the semiconductor device difficult.

As a method to solve this problem, an OPC technique is used for giving an correction pattern (OPC pattern) to a portion to which the pattern is not transcribed because of the optical proximity effect of the reticle pattern. Actually, as shown in a sketch after a correction on a right column of FIG. 1A, when the reticle pattern is rectangular, if a correction pattern is given around contour of four corners in the reticle pattern, only the roundness of the corner in the transcription pattern is suppressed, and the shortening of the pattern end is suppressed. Also, as shown in a sketch after a correction on a right column of FIG. 1B, a correction pattern is given to a portion adjacent to a line pattern, in order to make a line width in the periphery wider, which avoids the line to be made locally thinner.

By the way, in the conventional process for manufacturing a semiconductor, there may be a case that a pattern is directly observed on a wafer transcribed by using a reticle in which the optical proximity effect is corrected. However, there is no case that a reticle pattern is not directly observed in which the optical proximity effect is corrected. In short, whether or not the correction pattern is accurately given to the reticle is not checked on the reticle, and it is checked by using the pattern which is transcribed from the reticle onto the wafer. Thus, the correction pattern on the reticle is not evaluated.

Also, when the pattern on the reticle is evaluated, there is not a definite algorithm for discriminating between a non-correction pattern and a correction pattern.

SUMMARY OF THE INVENTION

The present invention is proposed to solve the above-mentioned problems in the conventional technique. It is therefore an object of the present invention to provide a method for measuring a fine pattern and an apparatus for measuring a fine pattern which can effectively measure a large number of optical proximity effect correction patterns by using a simple method, and a record medium that can store therein a program for measuring a fine pattern and can be read by a computer.

Another object of the present invention is to provide a method for measuring a fine pattern and an apparatus for measuring a fine pattern which can develop a mask process having a high quality, and a record medium that can store therein a program for measuring a fine pattern and can be read by a computer.

In order to attain the above-mentioned objects, the first feature of the present invention lies in a method for measuring a fine pattern, which at least comprises the steps of a first step of capturing an image of a fine pattern; a second step of extracting a contour of the fine pattern from the image of the fine pattern; a third step of capturing a standard figure of the fine pattern; a fourth step of superimposing the standard figure on the contour by enlarging or reducing the standard figure while maintaining an aspect ratio thereof; a fifth step of extracting an intersection of the contour and the standard figure; a sixth step of extracting a differential region surrounded with the contour of the fine pattern, the standard figure and the intersection; a seventh step of extracting a correction pattern region from the differential region; and an eighth step of measuring the correction pattern region. Here, the standard figure of the fine pattern corresponds to a non-corrected fine pattern. It may be prepared from a design pattern before a correction of a design pattern, such as a CAD data and the like, or it may be freely prepared by a engineer. Also, it can be extracted from the contour of the fine pattern.

According to the first feature of the present invention, since the correction pattern region can be measured by using a simple method, it is possible to effectively inspect a reticle in which the optical proximity effect is corrected. The standard figure is superimposed on the contour of the fine pattern by enlarging or reducing the standard figure while maintaining an aspect ratio thereof. Also, its size is changed in response to the contour of the fine pattern. Thus, a stable measurement can be done independently of a magnification of the image of the fine pattern and the like.

So, when a lithography process is developed, a measurement data of the correction for optical proximity effect pattern of the reticle can be effectively obtained in large quantities. Thus, it is possible to carry out the correction for optical proximity effect of the reticle much effectively. Also, when a mask process is developed, it is possible to check whether or not the correction pattern is desirably generated. Hence, it is possible to develop the mask process with a high quality. On the other hand, conventionally, the correction pattern can not be measured even in an actual mask management. So, there is only one method to test a success or failure of a mask once the pattern is formed on the wafer. However, it is possible to detect a error of the reticle before the pattern is actually formed on the wafer.

In the first feature of the present invention, the seventh step may be a step of extracting all the differential regions extracted at the sixth step, as the correction pattern region. Also, the seventh step may be composed of: a process for measuring an area of the differential region extracted at the sixth step; and a process for extracting the differential region having an area equal to or wider than a predetermined threshold as the correction pattern region. Moreover, the seventh step may be composed of: a process for indicating the differential region in a polar coordinate; a process for preparing a weighting function having a weight in an existence range of a correction pattern; a process for multiplying the differential region indicated by the polar coordinate by the weighting function; and a process for extracting as the correction pattern region the differential region after it is multiplied by the weighting function.

Also, in the method for measuring a fine pattern according to the first feature of the present invention, it is desirable that between the sixth step and the seventh step, there are further a step of comparing the number of differential regions with the number of correction patterns added to the standard figure and a step of measuring the area of the differential region. And, it is also desirable that the seventh step is divided into first to third cases as described below. At first, in the first case that the number of differential regions is equal to the number of correction patterns, the seventh step is a step at which all the differential regions are extracted as the correction pattern region. In the second case that the number of differential regions is greater than the number of correction patterns and two blocks are generated at a predetermined interval in a distribution of the areas of the differential regions, the seventh step is a step at which the differential region having the area equal to or wider than a predetermined threshold is extracted as the correction pattern region. And, in the third case that the number of differential regions is greater than the number of correction patterns and two blocks are not generated at a predetermined interval in a dispersion situation of the areas of the differential regions, the seventh step is composed of a process for indicating the differential region by using the polar coordinate, a process for preparing a weighting function having a weight in an existence range of a correction pattern, and a process for multiplying the differential region indicated by using the polar coordinate by the weighting function, and a process for extracting as a correction pattern region from the differential region after it is multiplied by the weighting function.

Here, it is desirable that the process for preparing the weighting function is composed of: an operation for determining a difference between a design pattern after a correction and a standard figure, and extracting a correction pattern; an operation for extracting a center of gravity in the standard figure; an operation for indicating the correction pattern in a polar coordinate with the center of gravity in the standard figure as an original point; and an operation for using the correction pattern indicated by the polar coordinate, and preparing a weighting function in which an existence range of the correction pattern is assumed to be 1 and a non-existence range of the correction pattern is assumed to be 0. It is also desirable that the standard figure in this case is prepared from a design pattern before the correction. Also, the process for preparing the weighting function may be composed of: an operation for indicating a contour of the fine pattern in a polar coordinate with the center of gravity in the standard figure superimposed at the fourth step as an original point; an operation for carrying out a frequency analysis, and removing a high frequency component of the contour indicated by the polar coordinate; an operation for carrying out a frequency analysis, and extracting an existence range of an correction pattern from a low frequency component of the contour indicated by the polar coordinate; and an operation for preparing a weighting function in which an existence range of the correction pattern is assumed to be 1 and a non-existence range of the correction pattern is assumed to be 0.

Also, it is desirable that the fourth step is composed of a process for indicating the contour in a polar coordinate; a process for indicating the standard figure in a polar coordinate; a process for preparing a weighting function having a weight in a non-existence range of an correction pattern; a process for multiplying the contour of the fine pattern by the weighting function; a process for multiplying the standard figure by the weighting function; a process for approximating the standard figure to the contour; and a process for indicating the contour of the fine pattern and the standard figure in an orthogonal coordinate.

Here, it is desirable that the process for preparing the weighting function having the weight in the non-existence range of the correction pattern is composed of: an operation for determining a difference between a design pattern after the correction and a standard figure, and extracting the correction pattern; an operation for extracting a center of gravity in the standard figure; an operation for indicating the correction pattern in a polar coordinate with the center of gravity in the standard figure as an original point; and an operation for using the correction pattern indicated by the polar coordinate, and preparing a weighting function in which an existence range of the correction pattern is assumed to be 0 and a non-existence range of the correction pattern is assumed to be 1. By the way, it is desirable that the standard figure in this case is prepared by a design pattern before the correction. Also, the process for preparing the weighting function having the weight in the non-existence range of the correction pattern may be composed of: an operation for indicating a contour of the fine pattern in a polar coordinate; an operation for carrying out a frequency analysis, and removing a high frequency component of the contour indicated by the polar coordinate; an operation for carrying out a frequency analysis, and extracting as an existence range of an correction pattern from a low frequency component of the contour indicated by the polar coordinate; and an operation for preparing a weighting function in which an existence range of the correction pattern is assumed to be 0 and a non-existence range of the correction pattern is assumed to be 1.

Moreover, it is desirable that the fourth step of superimposing the standard figure on the contour by enlarging or reducing the standard figure while maintaining an aspect ratio thereof, when the fine pattern is a pattern which is not a closed region, is composed of: a process for extracting a middle point between any two points in a portion corresponding to a non-corrected portion, on left and right contours extracted from the fine pattern; and a process for generating two parallel lines positioned at a distance equal to half of a line width from the middle point, as the standard figure.

The second feature of the present invention lies in an apparatus for measuring a fine pattern, comprising: a photographing device for obtaining an image of a fine pattern; a memory for storing therein a pattern data of a standard figure of the fine pattern; and an image processor which at least have a function of extracting a contour of the fine pattern from the image of the fine pattern, a function of superimposing the standard figure of the fine pattern on the contour of the fine pattern, a function of extracting an intersection of the standard figure and the contour of the fine pattern, a function of extracting a differential region surrounded with the standard figure, the contour and the intersection of them, a function of extracting a correction pattern from the differential region and a function of measuring the correction pattern.

The third feature of the present invention lies in a record medium, which can be read by a computer that stores therein a program for measuring a fine pattern and which comprises: a first step of capturing an image of a fine pattern; a second step of extracting a contour of the fine pattern from the image of the fine pattern; a third step of capturing a standard figure of the fine pattern; a fourth step of superimposing the standard figure on the contour by enlarging or reducing the standard figure while maintaining an aspect ratio thereof; a fifth step of extracting an intersection of the contour of the fine pattern and the standard figure; a sixth step of extracting a differential region surrounded with the contour of the fine pattern, the standard figure and the intersection; a seventh step of extracting a correction pattern region from the differential region; and an eighth step of measuring the correction pattern region.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 1A is a view describing a correction for optical proximity effect in a rectangular reticle pattern according to a conventional technique;

FIG. 1B is a view describing a correction for optical proximity effect in a line reticle pattern according to the conventional technique;

DETAILED DESCRIPTION OF THE PREFERRED INVENTION

Figure 2:
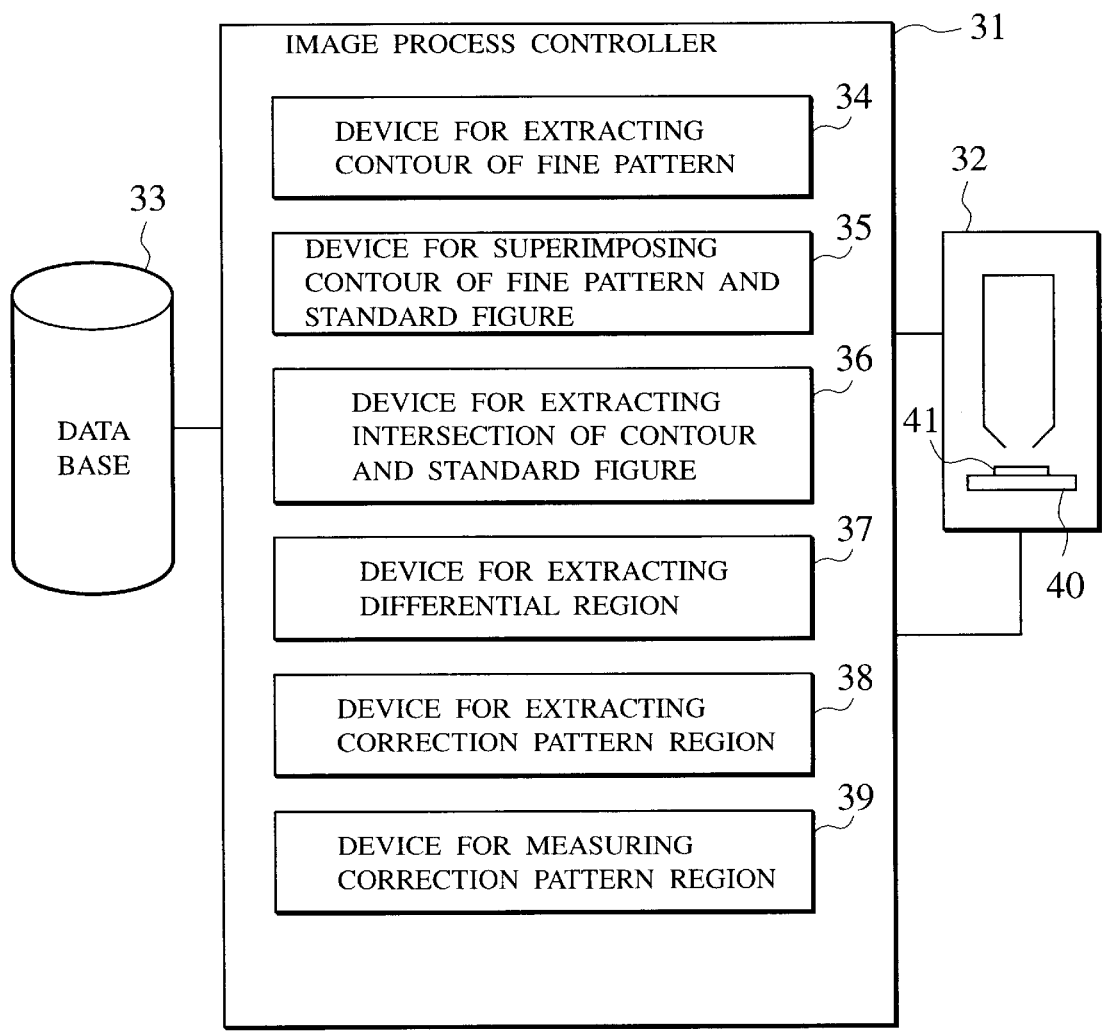
FIG. 2 is a view showing a configuration of an apparatus for measuring a fine pattern according to a first embodiment of the present invention.

Various embodiments of the present invention will be described with reference to the accompanying drawings. It is to be noted that the same or similar reference numerals are applied to the same or similar parts and elements will be omitted or simplified. Generally and as it is conventional in the representation of arbitrarily drawn for facilitating the reading of the drawings.

First Embodiment

Embodiments of the present invention will be described below with reference to the drawings. FIG. 2 is a view showing the configuration of an apparatus for measuring a fine pattern according to a first embodiment of the present invention. As shown in FIG. 2, the apparatus for measuring a fine pattern according to the first embodiment is provided with: a photographing device 32 for obtaining an image of a fine pattern; a memory 33 for storing therein a pattern data of a standard figure of the fine pattern; and an image processor 31 (an image process controller) which at least comprises a function 34 for extracting a contour of the fine pattern. from the image, a function 35 for superimposing the standard figure of the a fine pattern on the contour, a function 36 for extracting an intersection of the contour and the standard figure, a function 37 for extracting a differential region surrounded with the standard figure, the contour and those intersections, a function 38 for extracting a correction pattern region from the differential region and a function 39 for measuring the correction pattern region. Here, the standard figure of the fine pattern corresponds to a non-corrected fine pattern, and it can be generated from a design pattern before a correction of a design data, such as a CAD data and the like, or can be arbitrarily prepared by a engineer. Also, it can be extracted from the contour of the fine pattern. Also, a scanning electron microscope (hereafter, referred to as an SEM) 32 is used as the photographing device for obtaining the image of the fine pattern. A database 33 for storing therein the CAD data of the reticle pattern and the like is used as the memory for storing therein the pattern data of the standard figure of the fine pattern. As a measurement object having a fine pattern, a reticle used in a photolithography process of a semiconductor device is used to then use the fine pattern targeted for the measurement as the reticle pattern.

The photographing device, for example, the SEM 32 is a typical SEM having a body accommodating an electron gun, a focusing lens of an electron beam, a secondary electron detector detecting a secondary electron emitted from a reticle 41 and the like, an acceleration voltage power supply for supplying an acceleration voltage, a monitor for displaying a secondary electron image of the reticle 41 and a movable stage 40 on which the reticle is placed.

Figure 3:
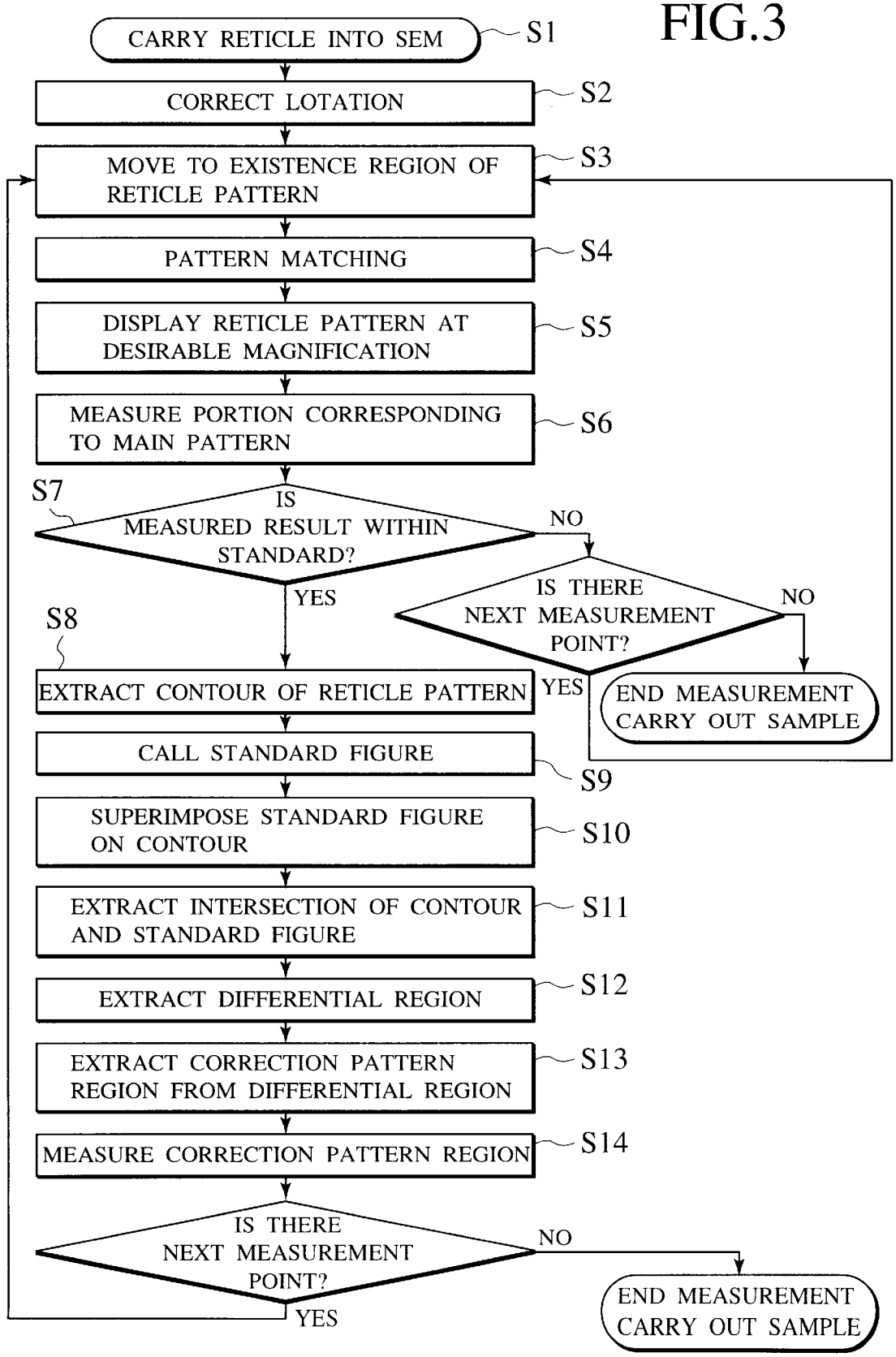
FIG. 3 is a flowchart showing a method for measuring a fine pattern according to the first embodiment of the present invention.

The apparatus for measuring the reticle pattern having the above-mentioned configuration can be used to measure the reticle pattern, in accordance with a flowchart shown in FIG. 3. The reticle is composed of a large number of reticle patterns having various shapes. Here, a rectangular reticle pattern among the reticle patterns is described as shown in FIG. 3.

(1) At first, the image of the reticle pattern is photographed at a first step. The first step is composed of steps S1 to S7, as shown in FIG. 3. The reticle is firstly carried into the SEM, and placed on the stage of the SEM (Step S1).

At a step S2, the acceleration voltage power supply of the SEM is turned on to accordingly emit the electron beam to the reticle. A signal from the secondary electron detector is displayed on a monitor, and the reticle is observed by SEM. While the reticle is observed, an alignment scan of the stage is done to then correct a location of the reticle and thereby adjust an angle of the reticle with respect to a monitor screen.

At a step S3, the stage is moving to thereby display a region including the reticle pattern targeted for the measurement on the monitor of the SEM. At this time, a magnification of the SEM may be a low magnification.

Figure 4:
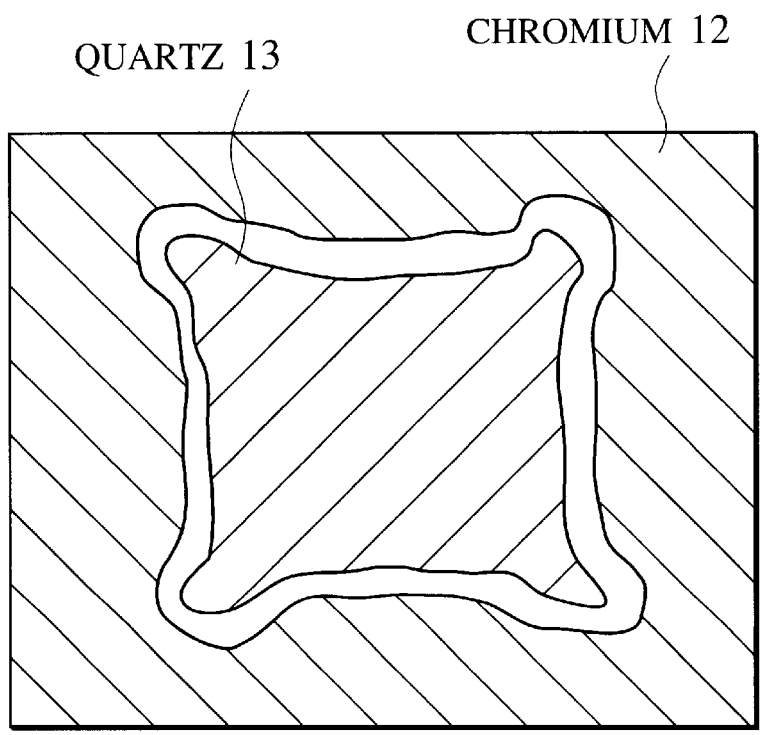
FIG. 4 is an SEM image of a reticle pattern.

At a step S4, operations, such as a pattern matching and the like, are repeated to then display the reticle pattern targeted for the measurement on the monitor at a high magnification. The pattern matching is a method for finding out the reticle pattern targeted for the measurement, from the reticle in which a large number of fine patterns, such as the reticle patterns and the like, are drawn. Its magnification is made higher in such a way that the reticle pattern targeted for the measurement displayed at a low magnification on the monitor screen is made closer to a center of the monitor screen, and simultaneously, the reticle pattern targeted for the measurement is not deviated from the monitor. The repetition of those operations enable the image of the reticle pattern targeted for the measurement to be displayed on the monitor at a desirable magnification, as shown in FIG. 4 (Step S5). FIG. 4 shows the SEM image of the reticle pattern targeted for the measurement. In FIG. 4, a chromium film 12 is deposited on a quartz 13, and the chromium film 12 is removed from a portion of a rectangular reticle pattern. Edge effects cause a portion between the quartz 13 and the chromium film 12 to be depicted brighter than other portions.

At a step S6, a portion corresponding to the standard figure is measured with regard to the displayed reticle pattern. A vertical length and a width of the reticle pattern are measured in a case of the rectangular reticle pattern.

At a step S7, if the measured result is not within a predetermined standard, namely, if a shape of the reticle pattern targeted for the measurement is largely deviated from the standard figure (Step S7 ; NO), a reticle pattern targeted for a next measurement is searched. If there is the next measurement target, the operational flow returns back to the operation at the step S3, and repeats the operations at the steps S3 to S7. If there is not the next measurement target, the measurement is ended, and the reticle is carried out from the SEM. If a dimension of a portion in which the reticle pattern targeted for the measurement is not corrected is not within the predetermined standard, a dimension of a pattern on a wafer that is transcribed by using the reticle is not within the standard. Thus, it is not necessary to measure the dimension of a correction pattern. On the other hand, if the dimension is within the standard (Step S7; YES), the operational flow proceeds to a next step.

Figure 5:
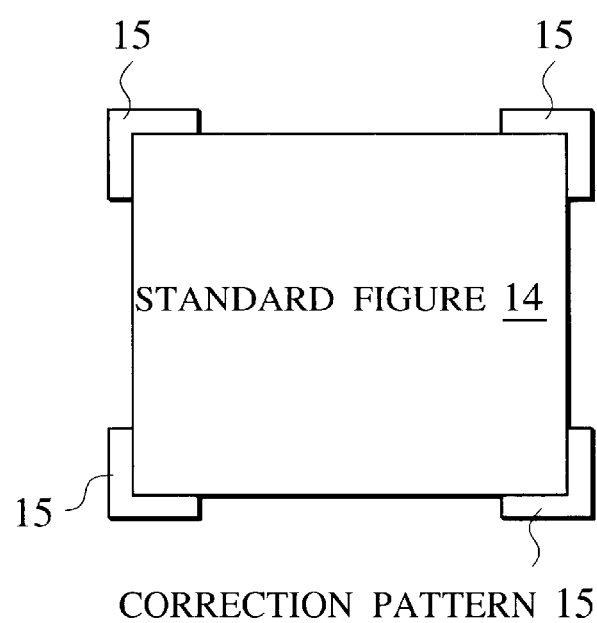
FIG. 5 is a view showing a design pattern of a reticle pattern.
Figure 6:
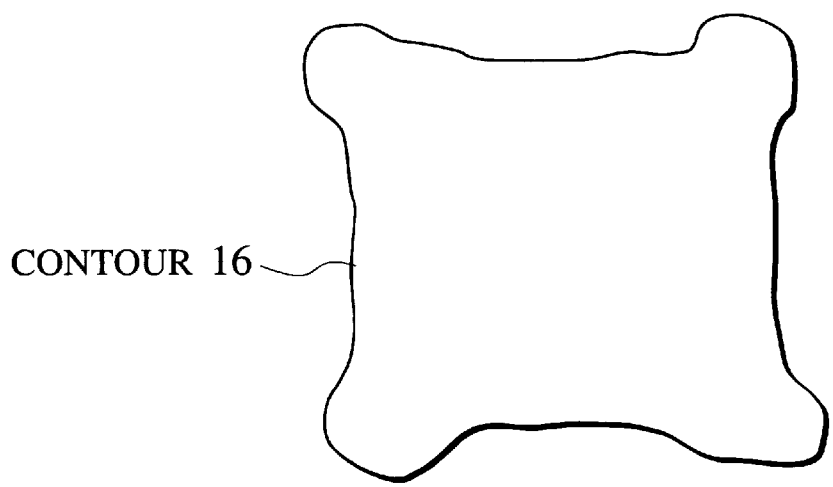
FIG. 6 is a contour of a reticle pattern extracted from the SEM image of FIG. 4.

(2) At a second step (Step S8), a contour of the reticle pattern is extracted from the SEM image of the reticle pattern. As a method for extracting the contour, an image is divided in accordance with a concentration. That is, the image depicted on the monitor is divided into three regions. In short, a three-value process of the SEM image of the reticle pattern is carried out. Typically in the reticle, the pattern is drawn with chromium (Cr) on a flat plate made of quartz. When this reticle pattern is observed by SEM, as shown in FIG. 4, an amount of secondary electrons emitted in the chromium 12 is greater than that in the quartz 13 so that the chromium 12 is higher in concentration than the quartz 13. Also, the edge effect causes the amount of the secondary electrons to be greater at an end of the chromium 12. Thus, in the SEM image, the concentration at the edge of the chromium 12 is higher than those of the chromium 12 and the quartz 13. Hence, the three-value processes of gray, black and white are performed on the three regions of the chromium 12, the quartz 13 and the edge, respectively. Then, a portion in a boundary between the white and the gray is extracted as the contour. FIG. 6 shows a contour 16 extracted in this way. Also, a method may be used for extracting as the contour the portion in which the concentration is sharply changed by applying a Laplacian filter and the like. Moreover, FIG. 5 shows a design pattern of the reticle pattern shown in FIG. 6. As shown in FIG. 5, the design pattern is composed of a standard FIG. 14 corresponding to a main pattern and a correction pattern.

Figure 14:
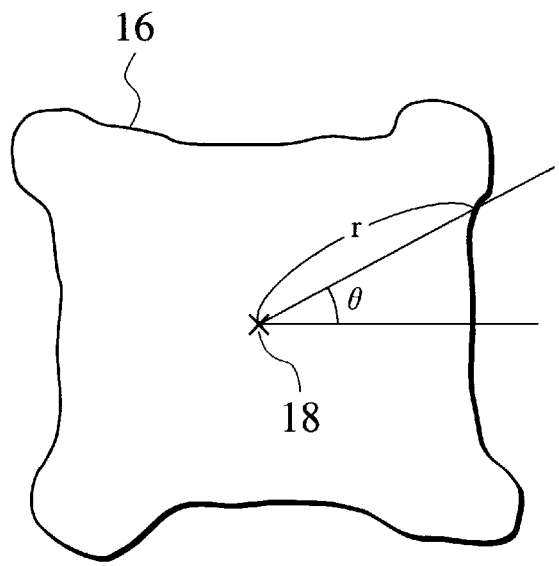
FIG. 14 is a view showing a method for converting a contour of a reticle pattern into a polar coordinate.

(3) At a third step (Step S9), the standard FIG. 14 of the fine pattern is called out. The standard FIG. 14 is generated in accordance with the design data, such as a CAD data and the like, which is prepared in the database in advance. Of course, the engineer may freely generate it.

Figure 7:
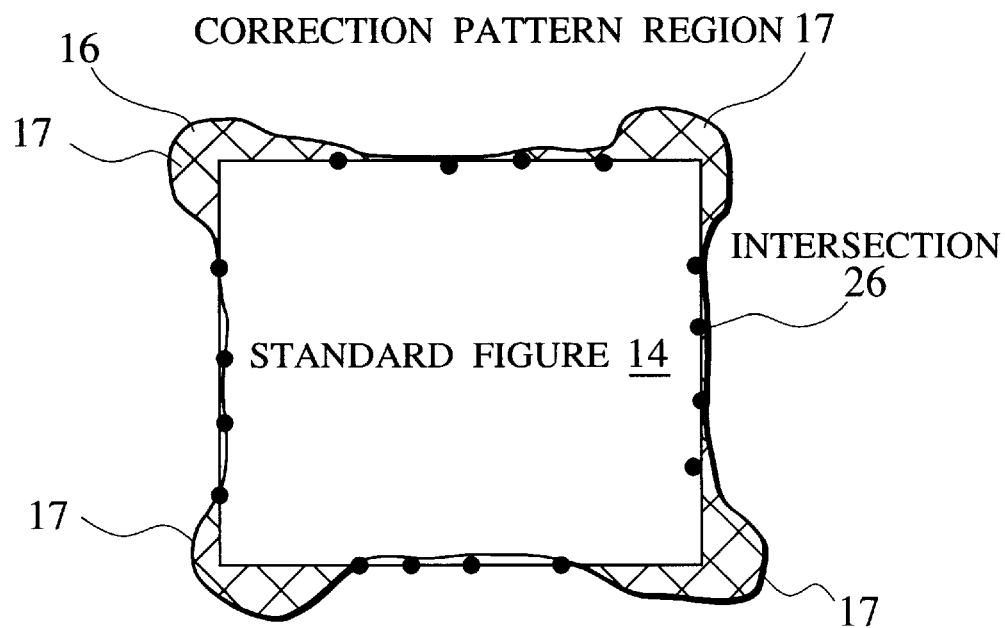
FIG. 7 is a view showing a standard figure and a contour of a reticle patterns which are superimposed.

(4) At a fourth step (Step S10), the standard FIG. 14 is enlarged or reduced while an aspect ratio thereof is maintained. Then, it is superimposed on the contour 16 of the reticle pattern. Since it is enlarged or reduced and then fitted into the contour 16 of the pattern while the information of the aspect ratio of the standard FIG. 14 is maintained, the standard FIG. 14 can be used irrespectively of a size variation and an observation magnification of the contour 16 of the reticle pattern. As the fitting method, a method for fitting the standard FIG. 14 into the contour 16 of the reticle pattern may be used such that a method of least square is used to reduce a difference between the coordinates of the standard FIG. 14 and the coordinates of the contour 16. FIG. 7 shows the contour 16 of the superimposed reticle patterns and the standard FIG. 14.

(5) At a fifth step (Step S11), intersections 26 of the standard FIG. 14 and the contour 16 of the reticle pattern are all extracted as shown in FIG. 7.

(6) At a sixth step (Step S12), a differential region is extracted which is surrounded with the contour 16 of the reticle pattern, the standard FIG. 14 and the intersections 26. The number of extracted differential regions is equal to the number of intersections 26 shown in FIG. 7.

(7) At a seventh step (Step S13), a correction pattern region 17 is extracted from the extracted differential region. Here, all the differential regions extracted at the sixth step are extracted as the correction pattern region 17. Here, the correction pattern region 17 implies the region corresponding to a correction pattern 15 among the regions surrounded with the contour 16 extracted from the image of the reticle pattern.

(8) Finally, at an eighth step (Step S14), the correction pattern region 17 is measured. An area, a center of gravity, a maximum diameter in a horizontal or vertical direction, a circumference length and the like with regard to the correction pattern region 17 are measured from the shape of the correction pattern region 17 targeted for the measurement. Moreover, a distance from the standard FIG. 14, a radius of curvature at an end of the correction pattern region 17 and the like are targeted for the measurement. Furthermore, if a plurality of correction patterns 15 are symmetrically given to the standard FIG. 14, the symmetry with regard to the shape of the correction pattern region 17 is also targeted for the measurement. As the symmetry measurement, there are a method for determining a position of a center of gravity in the correction pattern and then calculating a difference between the coordinates or a method for comparing the distances from the standard FIG. 14 or the areas.

The extraction and the measurement of the correction pattern region 17 from one reticle pattern is ended by the execution of the above-mentioned operations. If a pattern targeted for a next measurement exists in the same reticle, the operational flow returns back to the step S3 to move to an existence region of the pattern targeted for the measurement. Then, the operations at the above-mentioned steps are repeated in accordance with the flowchart shown in FIG. 2 from the step S3.

According to the first embodiment, the simple method can measure the correction pattern region 17. Thus, it is possible to effectively inspect the reticle on which the correction for optical proximity effect is performed. Also, the standard FIG. 14 is enlarged and reduced while the aspect ratio thereof is maintained, and the standard FIG. 14 is superimposed on the contour 16 of the reticle pattern. Moreover, its size is changed correspondingly to the contour 16 of the reticle pattern. Hence, the stable measurement can be done independently of the magnification of the image of the reticle pattern, the variation of the size of the reticle pattern and the like.

Thus, the measurement data of the correction for optical proximity effect pattern can be effectively obtained in large quantities when the lithography process is developed. Hence, it is possible to carry out the correction for optical proximity effect much effectively. Also, when a mask process is developed, it is possible to check whether or not the correction pattern is desirably generated. Hence, it is possible to develop the mask process with a high quality. On the other hand, conventionally, the correction pattern can not be measured even in an actual mask management. So, there is only one method to test a success or failure of a mask once the pattern is formed on the wafer. However, it is possible to detect the error of the reticle before the pattern is actually formed on the wafer.

(First Variation)

In the flowchart shown in FIG. 3, at the step S13 at which the correction pattern region 17 is extracted from the differential region, all the differential regions extracted at the step S12 are extracted as the correction pattern region 17. However, as shown in FIG. 6, the contour 16 of the reticle pattern has minute convex and concave portions, namely, edge roughness. So, the intersections 26 with the standard FIG. 14 superimposed on the contour 16 are extracted in large quantities, as shown in FIG. 7. Thus, the fact that all the differential regions surrounded with the contour 16, the standard FIG. 14 and the intersections 26 are defined as the correction pattern region 17 implies that even the region which is not the correction pattern is extracted as the correction pattern region 17. Hence, since the region caused by the edge roughness of the contour 16 is used as the correction pattern region 17, the number of pattern regions targeted for the measurement of the correction pattern after that is increased to thereby drop the image process efficiency.

So, in the first variation, a method for measuring a fine pattern is described which has the feature that the step S13 of extracting the correction pattern region 17 from the extracted differential region is provided with a process for measuring an area of the differential region extracted at the step S12 and a process for extracting as the correction pattern region 17 a differential region having an area equal to or wider than a predetermined threshold. By the way, an apparatus for measuring a fine pattern used in the first variation is equal to that of the first embodiment shown in FIG. 2. Also, the fine pattern targeted for the measurement employs the reticle pattern.

Figure 8:
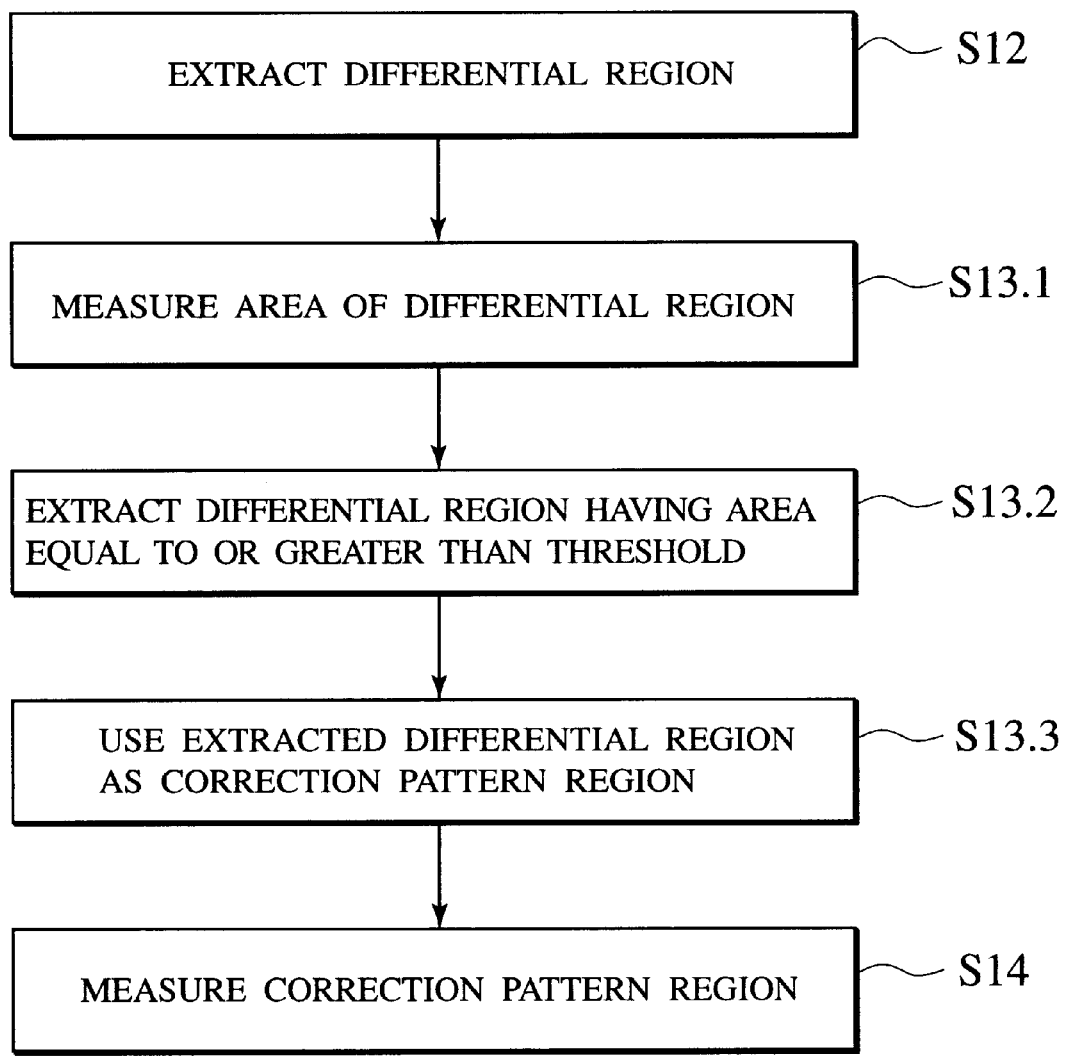
FIG. 8 is a flowchart showing a method for measuring a fine pattern according to a first variation.

FIG. 8 is a flowchart showing a process for configuring the seventh step (Step S13) shown in FIG. 3. As shown in FIG. 8, the step S13 is composed of steps S13.1 to S13.3.

(1) At first, at the step S13.1, the areas of all the differential regions extracted at the step S12 are measured.

(2) At the step S13.2, the differential region having the area equal to or wider than the predetermined threshold is extracted. The area serving as the predetermined threshold is a threshold to separate the differential region between the standard FIG. 14 and the contour 16 caused by the edge roughness of the contour 16, from the correction pattern region 17. The threshold is determined by considering the size of the correction pattern when it is designed, the degree of the edge roughness of the contour 16 of the reticle pattern, and the like.

(3) At the step S13.3, the extracted differential region is defined as the correction pattern region 17.

(4) Then, the correction pattern region shown in FIG. 3 is measured (Step S14).

According to the first variation, the correction pattern region 17 can be extracted, in accordance with the difference between the areas, from the extracted differential region based on the edge roughness of the contour 16 of the reticle pattern. Thus, after that, the target for the measurement of the correction pattern region 17 is limited to thereby enable the effective measurement.

(Second Variation)

In the flowchart shown in FIG. 8, in order to extract the correction pattern region 17 from the differential region surrounded with the contour 16 of the reticle pattern, the standard FIG. 14 and the intersections 26 of them, the areas of all the differential regions are measured, and the differential region having the area equal to or wider than the predetermined threshold is extracted as the correction pattern region 17. In short, both of them are discriminated by using the difference between the area of the correction pattern region 17 and the area of the differential region caused by the edge roughness of the contour 16. This method sufficiently functions if the edge roughness of the contour 16 of the reticle pattern is sufficiently small as compared with the size of the correction pattern region 17. However, this method does not function sufficiently if the edge roughness is large and thereby it can not be discriminated from the correction pattern region 17 based on the area.

So, in the second variation, a method for extracting the correction pattern region 17 from the differential region is described which multiplies the differential region by a weighting function having a weight in an existence range of the correction pattern 15. By the way, an apparatus for measuring a fine pattern used in the second variation is equal to that of the first embodiment shown in FIG. 2. Also, the fine pattern targeted for the measurement employs the reticle pattern.

Figure 9:
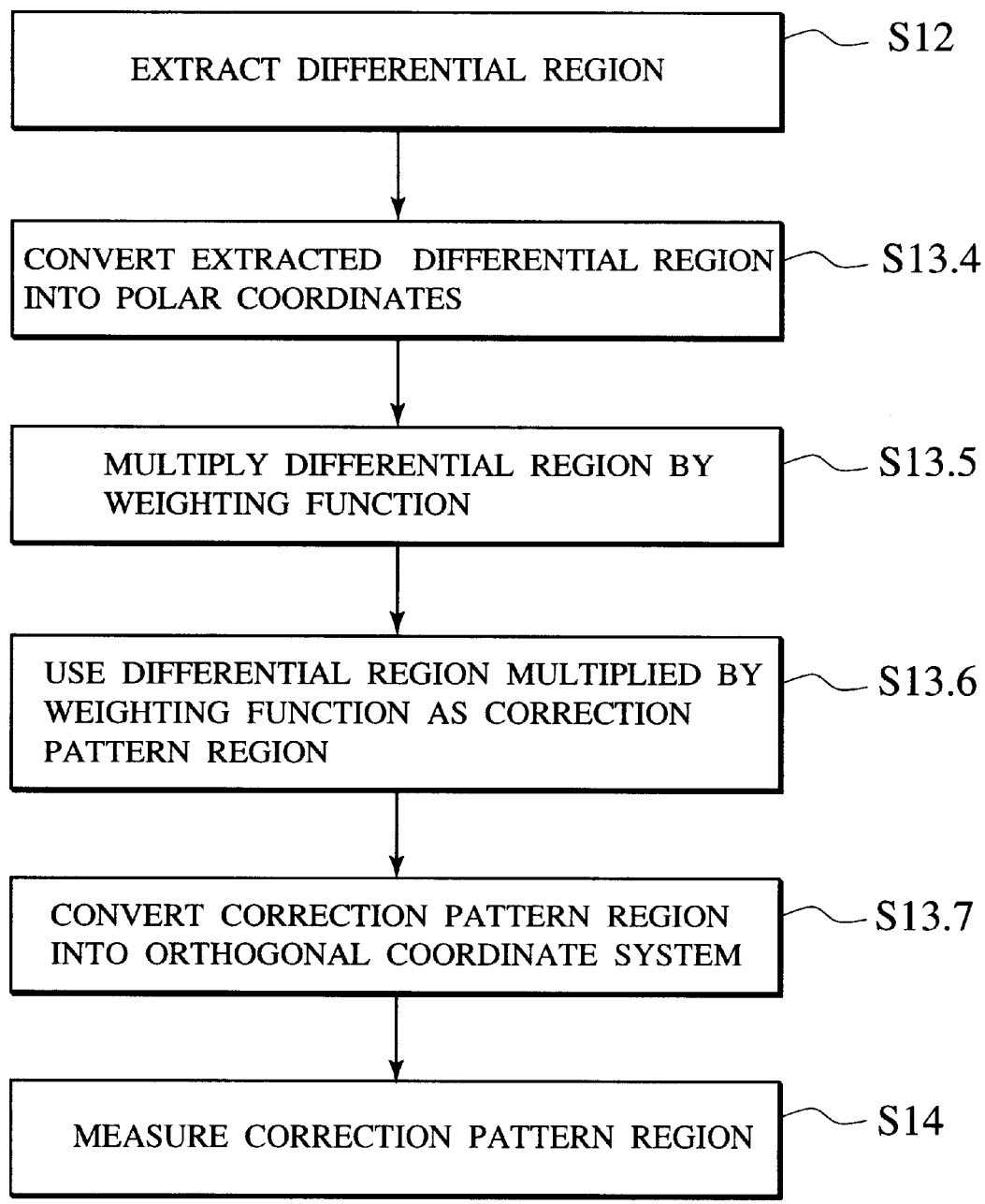
FIG. 9 is, a flowchart showing a method for measuring a fine pattern according to a second variation.

FIG. 9 is a flowchart showing a process for configuring the seventh step (Step S13) shown in FIG. 3. As shown in FIG. 9, the step S13 is composed of steps S13.4 to S13.7.

(1) At first, with regard to the differential region extracted at the step S12, the data of the extracted differential region is converted into a polar coordinate system, at the step S13.4. This polar coordinate uses a center of gravity in the superimposed standard figure, as an original point.

(2) At the step S13.5, the differential region on which the coordinate conversion is performed is multiplied by a weighting function having a weight in an existence range of the correction pattern 15.

(3) at the step S13.6, the differential region multiplied by the weighting function is defined as an correction pattern region 17.

(4) At the step S13.7, the correction pattern region 17 is converted into an orthogonal coordinate system.

(5) Then, the correction pattern region shown in FIG. 2 is measured (Step S14).

Figure 10:
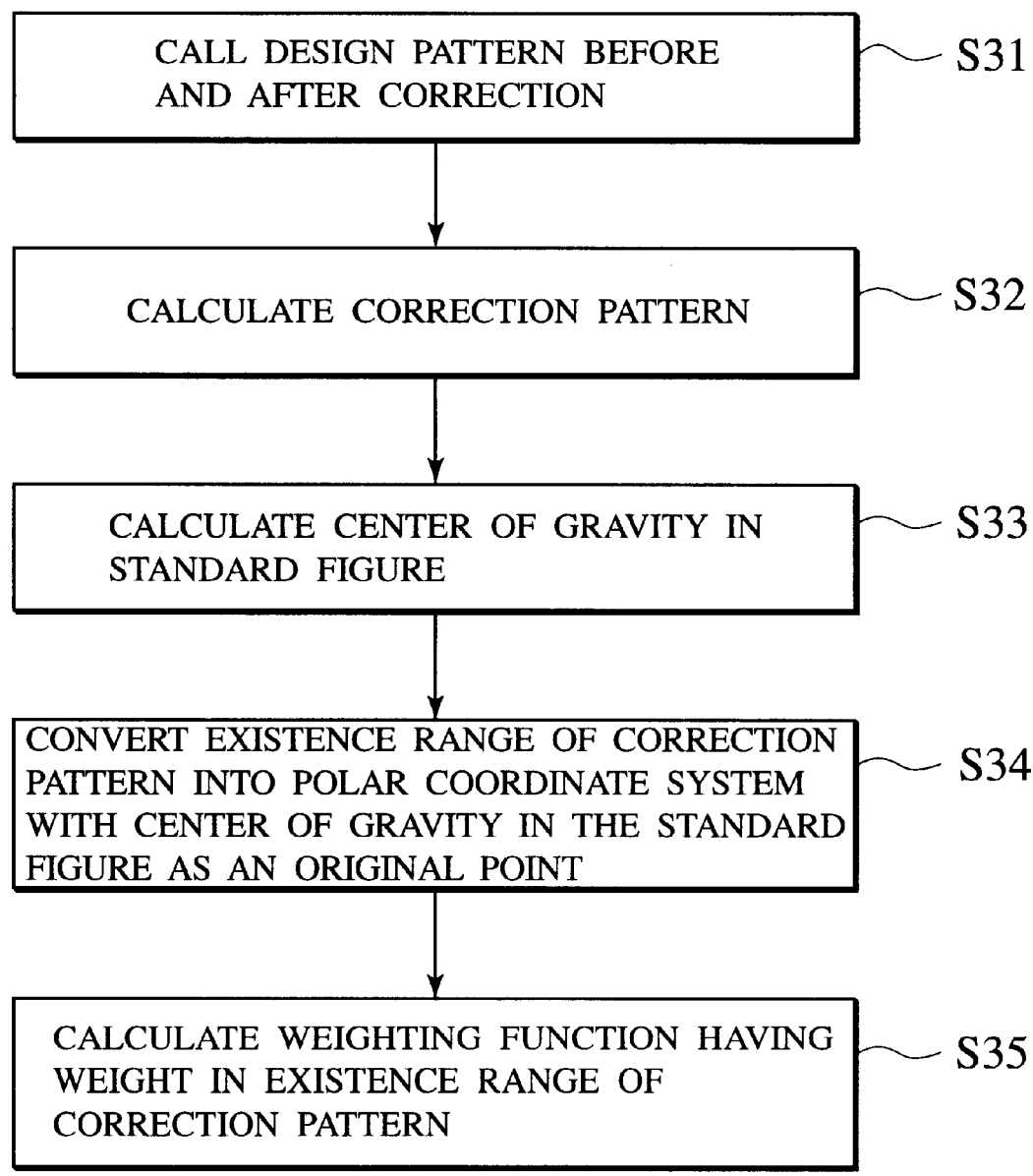
FIG. 10 is a flowchart showing a method for calculating a weighting function having a weight in an existence range of a correction pattern.
Figure 15:
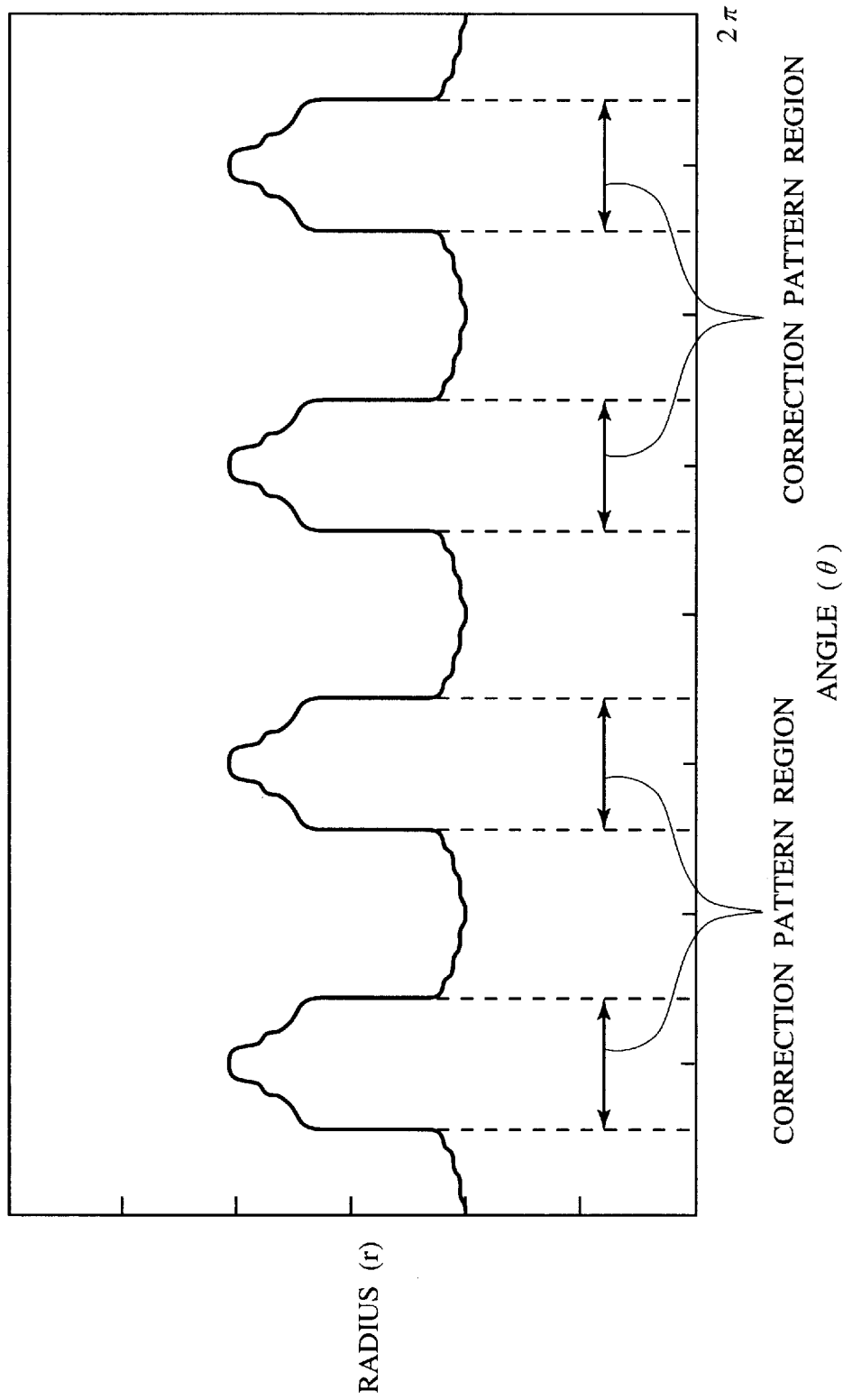
FIG. 15 is a graph indicating a contour of a reticle pattern indicated in a polar coordinate.

FIG. 10 shows a method for calculating the weighting function having the weight in the existence range of the correction pattern 15, as described at the step S13.5. This is done as shown in FIG. 15.

(1) At first, at a step S31, the standard FIG. 14 and the design pattern after the correction are called out from the database. By the way, it is desirable that the standard FIG. 14 in this case is generated from the design pattern before the correction.

(2) At a step S32, a difference between the design patterns before and after the correction is determined to thereby calculate the correction pattern 15.

(3) At a step S33, a center of gravity in the standard FIG. 14 is calculated.

Figure 11:
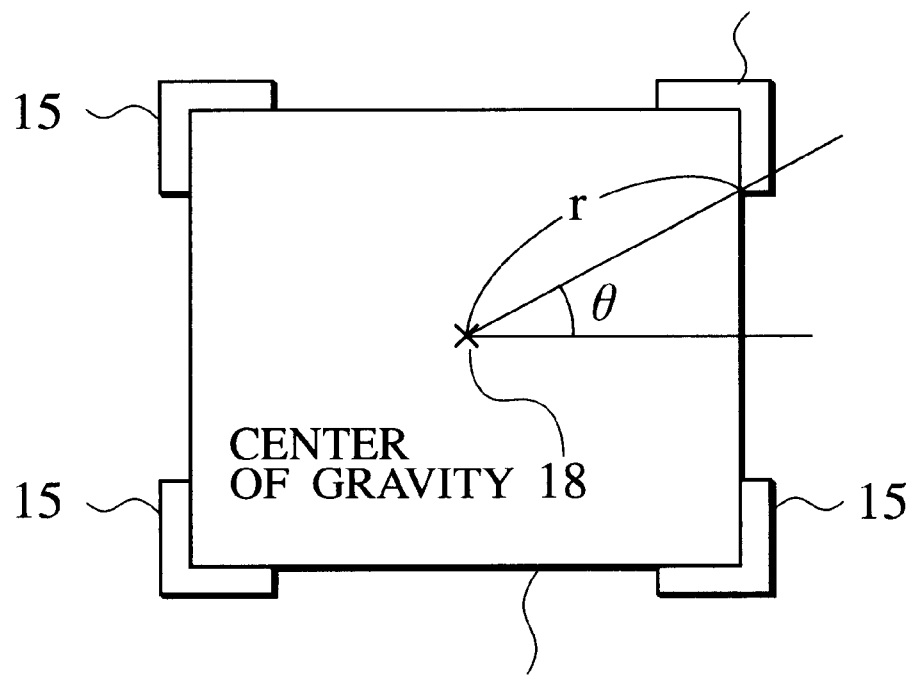
FIG. 11 is a view showing a method for converting a correction pattern into a polar coordinate.

(4) At a step S34, an existence range of the correction pattern 15 is converted into a polar coordinate system with the center of gravity in the standard FIG. 14 as an original point. FIG. 11 is a view showing the conversion into the polar coordinate system. As shown in FIG. 11, an existence range of the correction pattern 15 is represented by using an r-θ function, in the polar coordinate system with a center of gravity 18 in the standard FIG. 14 as the original point.

Figure 12:
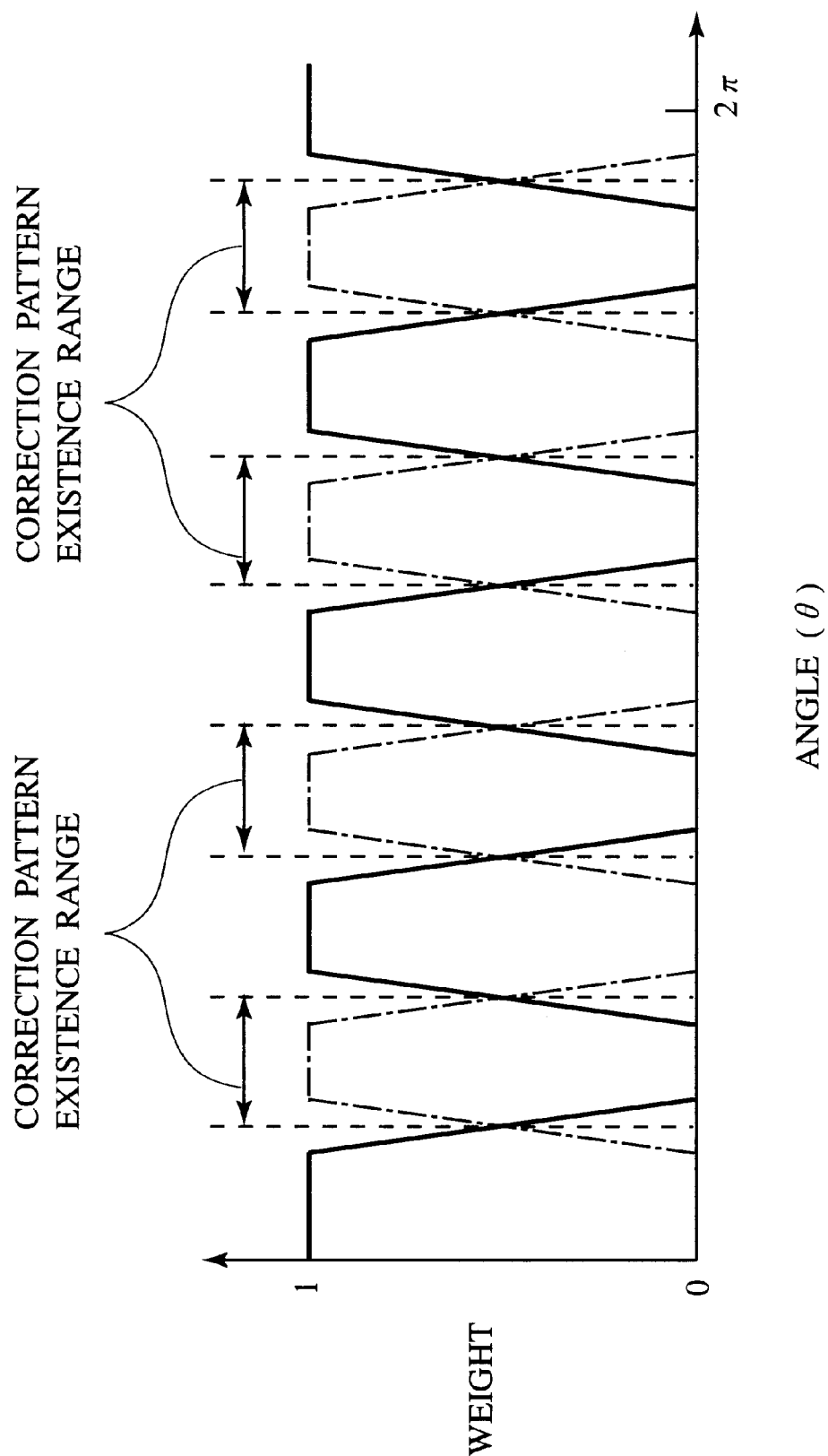
FIG. 12 is a graph showing a weighting function.

(5) Then, at a step S35, a weighting function is calculated in which an existence range of the correction pattern 15 is assumed to be 1, and a non-existence range of the correction pattern 15 is assumed to be 0. FIG. 12 is a view showing the weighting function. A horizontal axis indicates an angle from the original point, and a vertical axis indicates the weight. As indicated by alternate long and short dash lines, it is 1 in the existence range of the correction pattern 15, and it is 0 in the non-existence range of the correction pattern 15. Then, 1 and 0 are connected through definite inclinations. Of course, it may be a step function of 1 and 0 by making the inclination infinite. Since the differential region extracted at the step S12 of FIG. 3 is multiplied by such a weighting function, the differential region positioned in the existence range of the correction pattern 15 is multiplied by 1, and the differential region positioned in the non-existence range is multiplied by 0. Then, only the differential region positioned in the existence range of the correction pattern 15 can be left and automatically extracted as the correction pattern region 17. In short, in the first variation, the difference between both the areas is used to discriminate between the differential region caused by the edge roughness of the contour 16 and the correction pattern region 17. However, in the second variation, the correction pattern region 17 is extracted by discriminating between the existence range of the correction pattern 15 and the non-existence range, on the design.

According to the second variation, even if the edge roughness of the contour 16 of the reticle pattern is large, and the correction pattern region 17 can not be extracted, in accordance with the difference between the areas, from the differential region extracted by the edge roughness of the contour 16 of the reticle pattern, the correction pattern region 17 can be extracted by converting into the polar coordinate system and then multiplying by the weighting function in the same coordinate system.

(Third Variation)

Figure 13:
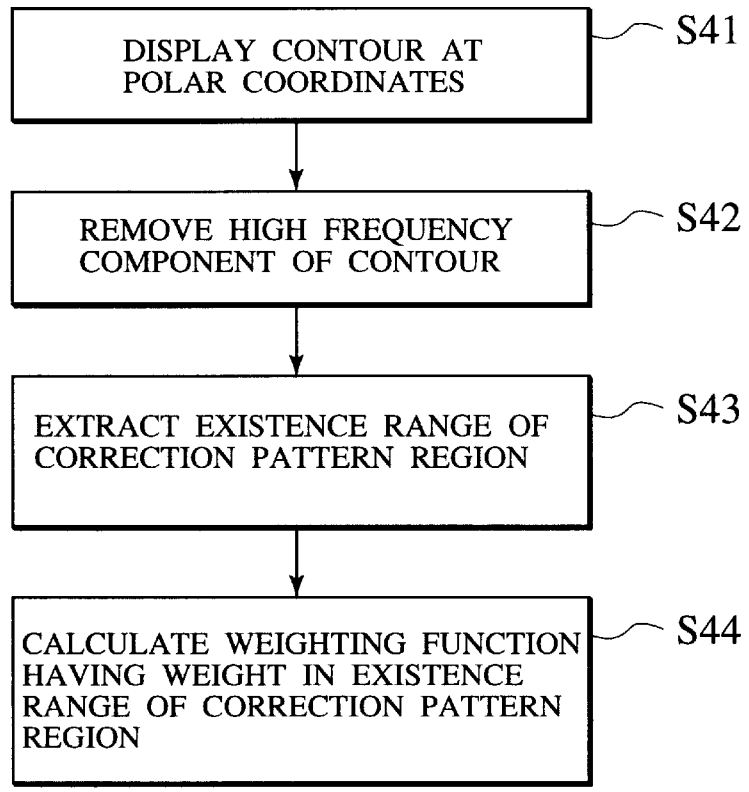
FIG. 13 is a flowchart showing a method for calculating a weighting function having a weight in an existence range of a correction pattern region.

In the second variation, the weighting function by which the differential region is multiplied is the weighting function having the weight in the existence range of the correction pattern 15 calculated by using the correction pattern 15 determined from the design patterns before and after the correction. In the third variation, a method for extracting a correction pattern region 17 is described in which if the design pattern after the correction can not be obtained and thereby the correction pattern 15 can not be determined, the weighting function similar to that of the second variation is calculated from the contour 16 indicated by using the polar coordinate, and then this weighting function is used to extract the correction pattern region 17. FIG. 13 is a flowchart showing a method for calculating a weighting function according to a third variation. This is done as shown in FIG. 13.

(1) At first, at a step S41, the data of the contour 16 of the reticle pattern is converted into the polar coordinate system, and the contour 16 is indicated by using the polar coordinate. In short, as shown in FIG. 14, the contour 16 is indicated by using an angle (θ) and a distance (r) from an original point 18. The original point 18 in the polar coordinate is the center of gravity in the standard FIG. 14 superimposed on the contour 16 at the step S10 of FIG. 3. FIG. 15 shows the contour 16 of the reticle pattern indicated by using the polar coordinate. As shown in FIG. 15, the edge roughness that is the minute convex and concave portions (high frequency components) exists in the contour 16. Also, large convex and concave portions (low frequency components), indicate the existence range of the correction pattern region 17.

Figure 16:
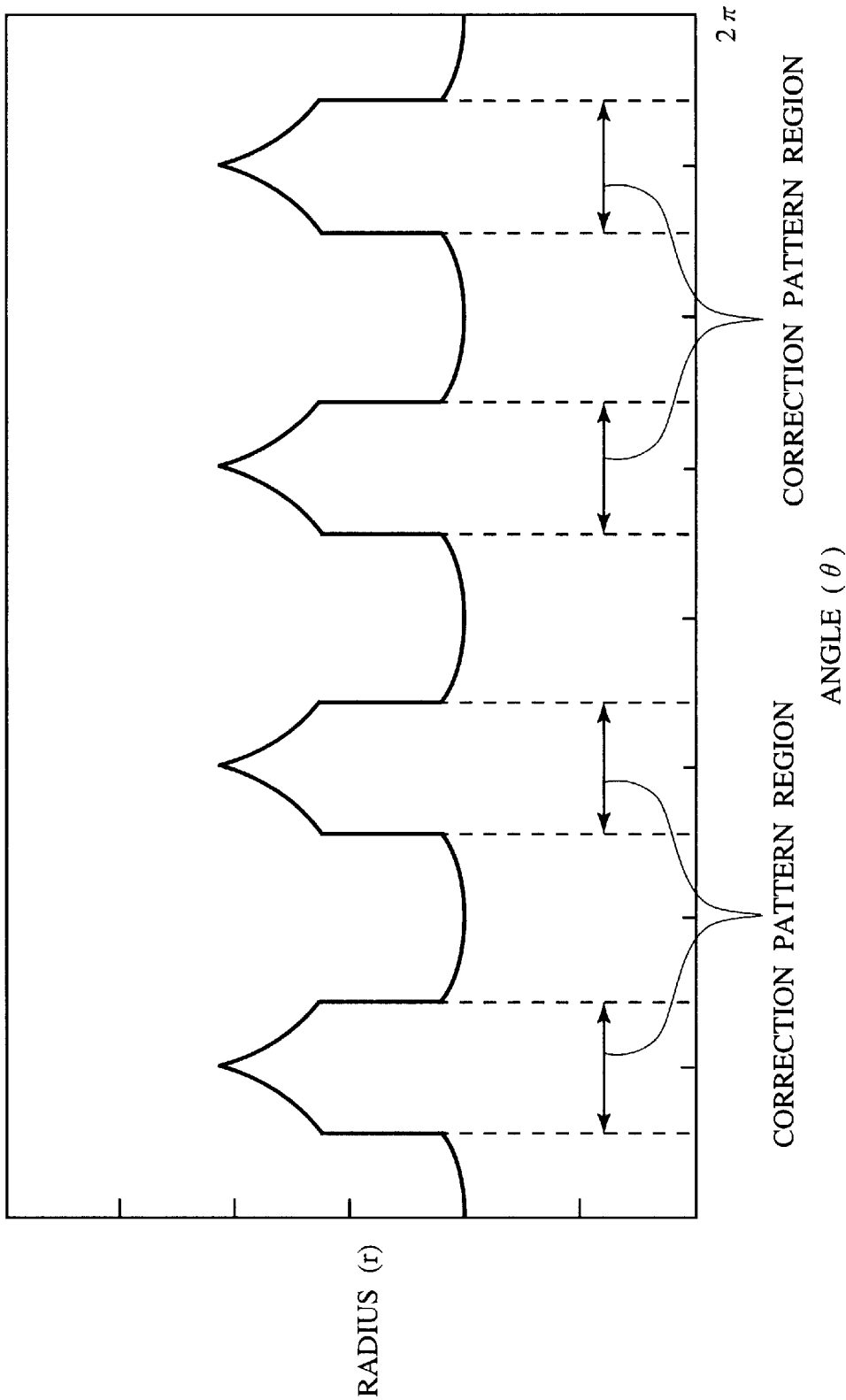
FIG. 16 is a graph showing a contour of a reticle pattern in which a high frequency component is removed from the contour shown in FIG. 15.

(2) At a step S42, in order to remove the edge roughness of the contour 16 indicated by using the polar coordinate, a frequency analysis is carried out to then remove the high frequency component in the contour 16. In short, a smoothing process is performed on the contour 16 shown in FIG. 15. FIG. 16 is a view showing the contour 16 in the polar coordinate after the removal of the high frequency component.

(3) At a step S43, the frequency analysis is done. Then, the existence range of the correction pattern region 17 is extracted from the low frequency component of the contour 16. As shown in FIG. 16, the large convex and concave portions (the low frequency components) indicative of the existence range of the correction pattern region 17 becomes brilliant in the contour 16 after the removal of the high frequency component. The radius (r) of the contour 16 becomes longer in the existence range of the correction pattern region 17, and the radius (r) becomes shorter in the non-existence range. Thus, in the low frequency component, the range in which the radius (r) of the contour 16 becomes longer can be extracted as the existence range of the correction pattern region 17.

(4) At a step S44, a weighting function is calculated in which the existence range of the correction pattern region 17 is assumed to be 1, and the non-existence range is assumed to be 0. The calculated weighting function is represented as the alternate long and short dash lines of FIG. 12, similarly to the second variation. As indicated by the alternate long and short dash lines of FIG. 12, it is 1 in the existence range of the correction pattern region 17, and it is 0 in the non-existence range of the correction pattern. Then, 1 and 0 are connected through definite inclinations. Of course, it may be a step function of 1 and 0 by making the inclination infinite. Since the differential region extracted at the step S12 of FIG. 3 is multiplied by such a weighting function, the differential region positioned in the existence range of the correction pattern region 17 is multiplied by 1, and the differential region positioned in the non-existence range is multiplied by 0. Then, only the differential region positioned in the existence range of the correction pattern region 17 can be left and automatically extracted as the correction pattern region 17.

In short, in the second variation, the existence range of the correction pattern 15 is extracted from the design patterns before and after the correction to then calculate the weighting function. However, in the third variation, the design pattern after the correction is not used. Then, the weighting function can be calculated by extracting the existence range of the correction pattern region 17 from the contour 16 of the reticle pattern.

According to the third variation, the existence range of the correction pattern region 17 can be extracted from the contour 16 of the reticle pattern. Thus, it is possible to calculate the weighting function having the weight in the existence range of the correction pattern region 17, without requiring the design pattern after the correction.

(Fourth Variation)

Figure 18:
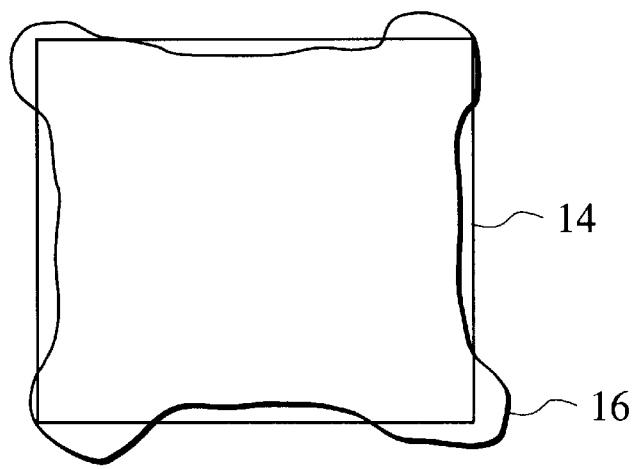
FIG. 18 is a view showing a standard figure and a contour which are wrongly superimposed.

At the step S10 of the flowchart shown in FIG. 3, the least square method is used to superimpose the standard FIG. 14 on the contour 16 of the reticle pattern. However, when the correction pattern 15 is the relatively large pattern as compared with the standard FIG. 14, if the standard FIG. 14 is tried to be uniformly superimposed on the entire range of the contour 16, there may be a case that the standard FIG. 14 is superimposed on a middle position of the correction pattern region 17, as shown in FIG. 18. In short, if the perfectly same weight is given to the entire range of the contour 16 to then approximate to the standard FIG. 14, it is superimposed such that the correction pattern region 17 is included. Such a superimposition disables the standard FIG. 14 to be accurately extracted.

Figure 17:
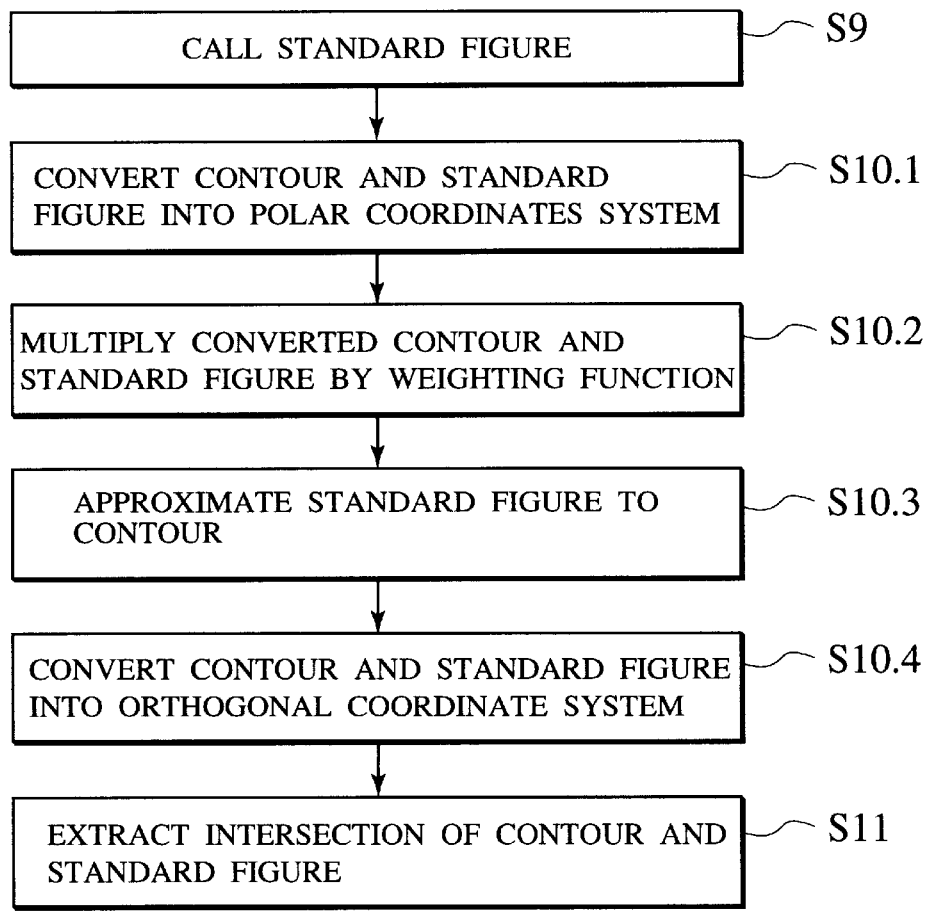
FIG. 17 is a flowchart showing a method for superimposing a standard figure on a contour according to a fourth variation.

So, in the fourth variation, an superimposing method is described which accurately superimposes the standard FIG. 14 on the contour 16 by multiplying the contour 16 and the standard FIG. 14 by a weighting function having a weight in a non-existence range of the correction pattern 15 or the correction pattern region 17. FIG. 17 is a flowchart showing the superimposing method according to the fourth variation. This is done as shown in FIG. 17.

(1) At first, at a step S10.1, the data of the standard FIG. 14 called out at the step S9 of FIG. 3 and the data of the contour 16 of the reticle pattern are respectively converted into the same polar coordinate system, and the standard FIG. 14 and the contour 16 are indicated by using the polar coordinate.

(2) At a step S10.2, the contour 16 of the reticle pattern and the standard FIG. 14 are respectively multiplied by the weighting function having the weight in the non-existence range of the correction pattern 15.

(3) At the step S10.3, the least square method is used to approximate the standard FIG. 14 to the contour 16 of the reticle pattern and then superimpose the standard FIG. 14 on the contour 16.

(4) Then, the data of the contour 16 of the reticle pattern and the data of the standard FIG. 14 are converted into the orthogonal coordinate system, and the contour 16 and the standard FIG. 14 are indicated in the orthogonal coordinate system.

The method for calculating the weighting function having the weight in the non-existence range of the correction pattern 15 as described at the step S10.2 can employ the calculating method based on the flowchart shown in FIG. 10 in the second variation. Or, it may use the weighting function having the weight in the non-existence range of the correction pattern region 17 calculated by using the method shown in FIG. 13 in the third variation, instead of the correction pattern 15. However, at the step S35 of the flowchart shown in FIG. 10 and at the step S44 of the flowchart shown in FIG. 13, the range having the weight is assumed to be the non-existence range, and it is not assumed to be the existence range of the correction pattern 15 or the correction pattern region 17. In short, the weighting function is calculated in which the existence range of the correction pattern 15 or the correction pattern region 17 is assumed to be 0 and the non-existence range is assumed to be 1.

FIG. 12 shows the thus-calculated weighting function by using solid lines. As shown by the solid lines of FIG. 12, it is 0 in the existence range of the correction pattern 15, and it is 1 in the non-existence range of the correction pattern 15. Then, 1 and 0 are connected through definite inclinations. Of course, it may be a step function of 1 and 0 by making the inclination infinite. Since the contour 16 and the standard FIG. 14 are multiplied by such a weighting function at the step S10.2 of FIG. 17, the standard FIG. 14 and the contour 16 positioned in the existence range of the correction pattern 15 is multiplied by 0, and the standard FIG. 14 and the contour 16 positioned in the non-existence range is multiplied by 1. Then, only the standard FIG. 14 and the contour 16 positioned in the non-existence range of the correction pattern 15 is left. Thus, the approximation of the left standard figure and left contour 16 enables the standard FIG. 14 to be accurately approximated to the portion corresponding to the standard FIG. 14 in the contour 16 of the reticle pattern.

(Fifth Variation)

In the first embodiment and the first to fourth variations, the case of the figure pattern of the reticle pattern targeted for the measurement is described in which the closed region is generated such as the rectangle. However, the present invention may be applied to a case in which a correction pattern given to a pattern that is not the closed region such as the line pattern is targeted for the measurement. So, in the fifth variation, a case is described in which a fine pattern that is not the closed region is targeted for the measurement, with a line reticle pattern as an example. Here, the fifth variation may use the apparatus for measuring the fine pattern, as shown in FIG. 2. It may use the SEM as the photographing device for obtaining the image of the fine pattern. Also, it may use the method for measuring the fine pattern, as shown in the flowchart of FIG. 3. Moreover, it may use the method for extracting the correction pattern region 17, as shown in the first to fourth variations, and the method for superimposing the standard FIG. 14 on the contour 16.

Figure 19:
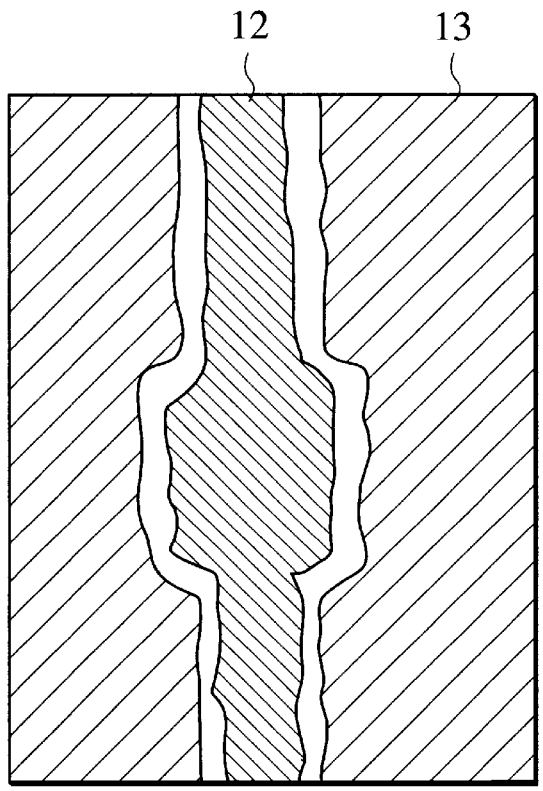
FIG. 19 is an SEM image of a line pattern.
Figure 20:
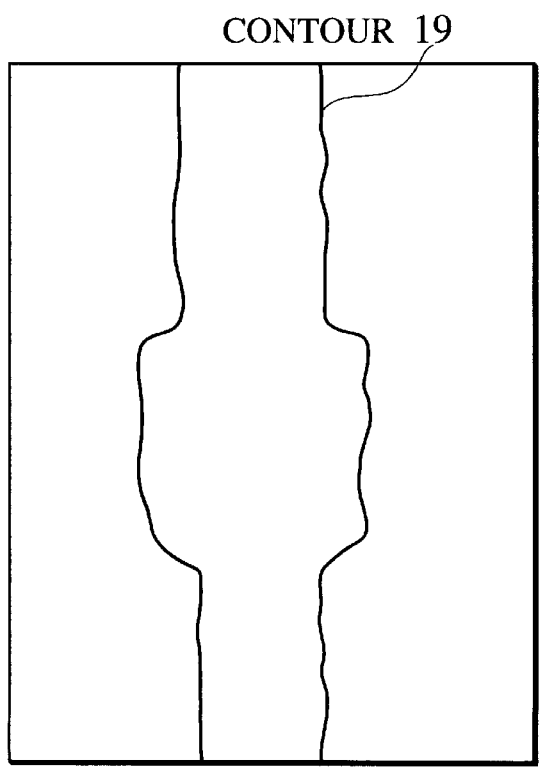
FIG. 20 is a view showing a contour of a line pattern.
Figure 21:
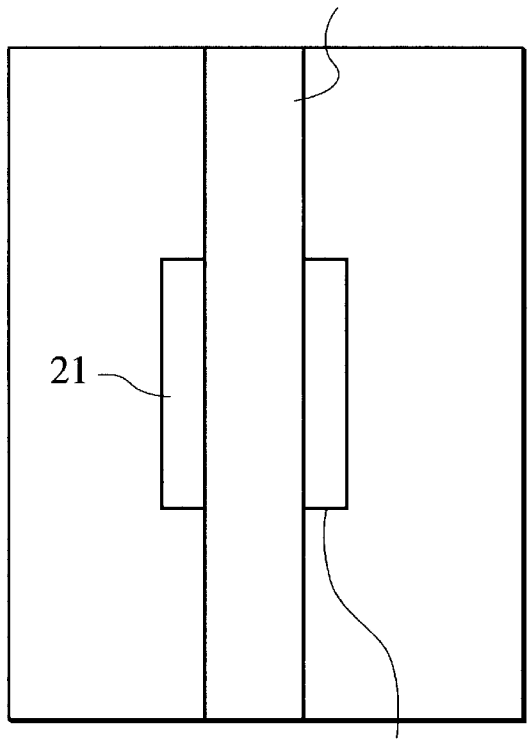
FIG. 21 is a view showing a design pattern of a line pattern.

FIG. 19 shows an image of a reticle pattern that is targeted for the measurement and displayed on the monitor, at the step S5 of FIG. 3. The pattern in the reticle is drawn with the chromium (Cr) on the flat plate made of quartz, similarly to the image of the rectangular reticle pattern shown in FIG. 4. However, in a case of the reticle pattern shown in FIG. 19, the line pattern is drawn with the chromium 12, on the quartz 13. When it is observed by SEM, the amount of secondary electrons emitted from the chromium 12 is greater than that in the quartz 13. Thus, the concentration of the chromium 12 is higher than that of the quartz 13. Also, the edge effect causes the amount of the secondary electrons to be greater at the end of the chromium 12. Hence, the concentration of the edge portion in the chromium 12 is higher than those of the chromium 12 and the quartz 13. So, the three-value processes of gray, black and white are performed on the three regions of the chromium 12, the quartz 13 and the edge portion, respectively. Then, the portion in the boundary between white and black is extracted as the contour, in FIG. 19. FIG. 20 shows a contour 19 extracted as mentioned above. Also, a method may be employed for extracting as the contour the portion in which the concentration is sharply changed by applying the Laplacian filter and the like. FIG. 21 shows a design pattern of a line pattern. As shown in FIG. 21, the design pattern is composed of a standard FIG. 20 composed of two parallel lines having predetermined line widths and correction patterns 21 positioned at both ends of the standard FIG. 20.

Figure 22:
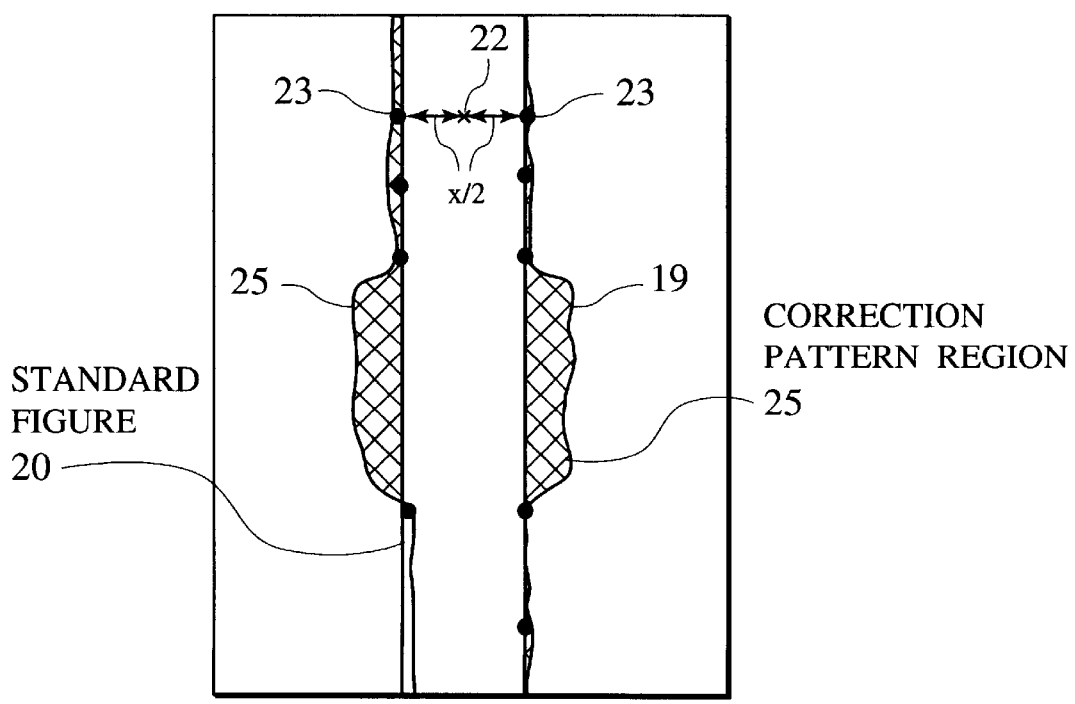
FIG. 22 is a view showing a standard figure and a contour of a line pattern which are superimposed.

If the target for the measurement is the line pattern and then the standard figure shown in FIG. 21 can not be obtained, the superimposition of the standard FIG. 20 on the contour 19 at the step S10 of FIG. 3 may be done as follows. At first, as shown in FIG. 22, any two points 23 in the portions corresponding to the non-correction are selected on the left and right contours 19 extracted from the reticle pattern, and a middle point 22 is extracted between those two points 23. Then, two parallel lines positioned at a distance equal to half the line width from the middle point 22 are generated as the standard FIG. 20. The generated parallel lines become the standard FIG. 20 superimposed on the contour 19. The image procedure after that is equal to those shown in the first embodiment and the first to fourth variations.

According to the fifth variation, the standard FIG. 20 can be superimposed on the contour 19 of the reticle pattern, even for the pattern in which the target for the measurement is not the closed region such as the line pattern. Thus, the correction pattern can be stably extracted and measured even for the fine pattern in which the closed region is not generated.

By the way, in the reticle serving as the observed matter, the reticle pattern targeted for the measurement may be used as the reticle pattern used for the actual device fabrication. However, a monitor pattern is set in a blank space, which is then used as the reticle pattern targeted for the measurement. So, it is allowable to manage and evaluate the reticle pattern used for the actual device fabrication.

Also, the step function which indicates 1 in the weighted range and 0 in the other ranges is used as the weighting function in the present invention. However, if a function is such that the heavy weight is given to the targeted region, the function does not need to be 1 or 0, and may be another function.

Moreover, in the first embodiment the scanning electron microscope is used as the measuring apparatus. However, the present invention may be applied to other measuring apparatus, such as an optical microscope and the like. Also, this embodiment uses the reticle as the measured sample. However, it may use a wafer or other samples.

(Other Variations)

As mentioned above, the first embodiment of the present invention also discloses the variations described in the first to fifth variations. However, it should not be understood that the discussions and drawings constituting a part of the disclosure do not limit this embodiment. Various other variations and operation techniques will become obvious for those skilled in the art, from the disclosure.

At first, the method for extracting all the differential regions as the correction pattern region was firstly described in the first embodiment, as the method for extracting the correction pattern region from the differential region extracted from the contour, the standard figure and the intersections of them. The first variation illustrated the extracting method based on the threshold of the area. The second and third variations illustrated the method for extracting by using the weighting function having the weight in the existence range of the correction pattern. The engineer may determine in advance which method among them is to be selected. Or, the engineer may use a method for judging from the distribution of the areas of the extracted differential regions. Actually, it is desirable that between the steps S12 to S13 of FIG. 3, there are further a step of comparing the number of differential regions with the number of correction patterns added to the standard figure and a step of measuring the area of the differential region. And, it is also desirable that the step 13 is divided into first to third cases as described below. At first, in the first case that the number of differential regions is equal to the number of correction patterns, the step S13 is a step at which all the differential regions are extracted as the correction pattern region. In the second case that the number of differential regions is greater than the number of correction patterns and two blocks are generated at a predetermined interval in a distribution of the areas of the differential regions, the step S13 is a step at which the differential region having the area equal to or wider than a predetermined threshold is extracted as the correction pattern region. And, in the third case that the number of differential regions is greater than the number of correction patterns and two blocks are not generated at a predetermined interval in a dispersion situation of the areas of the differential regions, the step S13 is composed of a process for indicating the differential region by using the polar coordinate, a process for preparing a weighting function having a weight in an existence range of a correction pattern, and a process for multiplying the differential region indicated by using the polar coordinate by the weighting function, and a process for extracting as a correction pattern region the differential region after it is multiplied by the weighting function. By the way, it is desirable that the apparatus for measuring the fine pattern shown in FIG. 2 further has a process controller for selecting the above-mentioned first to third cases.

Also, in the first embodiment, it is described that the standard figure of the fine pattern indicates the fine pattern before the correction using the OPC technique. For example, it may use the CAD data before the correction, and it may be freely generated by the engineer. However, it is also possible to directly extract from the contour of the fine pattern. Its method will be described below.

Figure 23A:
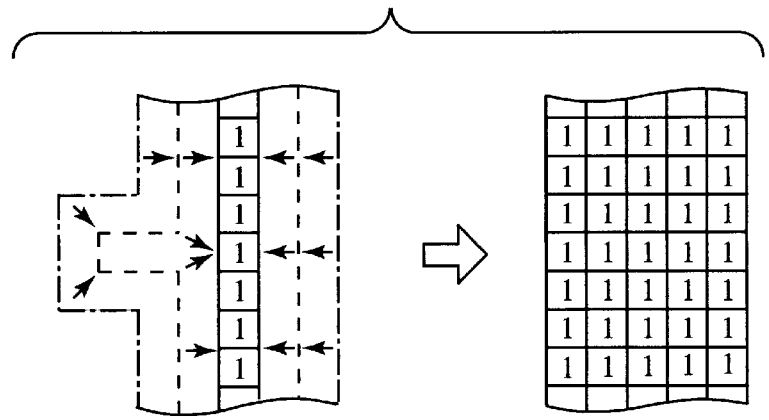
FIG. 23A is a view describing a method for extracting a standard figure from a convex contour of fine pattern.
Figure 23B:
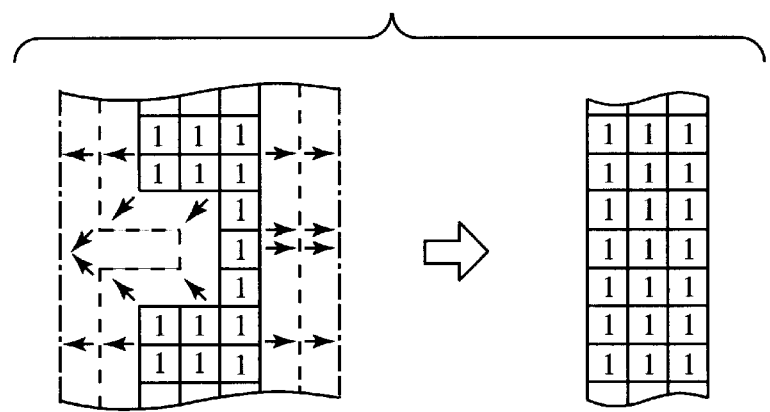
FIG. 23B is a view describing a method for extracting a standard figure from a concave contour of fine pattern.

At first, a two-value process is carried out in which the existence region of the fine pattern is assumed to be 1, and the non-existence region is assumed to be 0. Then, a process is carried out in which all the regions of 1 adjacent to the regions of 0 are set to 0. This process is referred to as a reduction process. Actually, once the reduction process is performed on convex pattern as shown by alternate long and short dash lines on a left side of FIG. 23A, a pattern is generated as indicated by dotted lines. The convex shape is still generated in the pattern shown by the dotted lines. When the reduction process is again performed, a pattern without the convex shape is generated as shown by solid lines. Next, a process for setting all the regions of 0 adjacent to the regions of 1 to 1 is performed on the pattern two times, on which the reduction process is performed two time. This process is referred to as an dilation process, for the reduction process. Two executions of the dilation process enable a pattern without the convex shape to be generated as shown on a right side of FIG. 23A. In FIG. 23B, a concave shape can be cancelled out by firstly carrying out the dilation process two times and then carrying out the reduction process two times.

Figure 24:
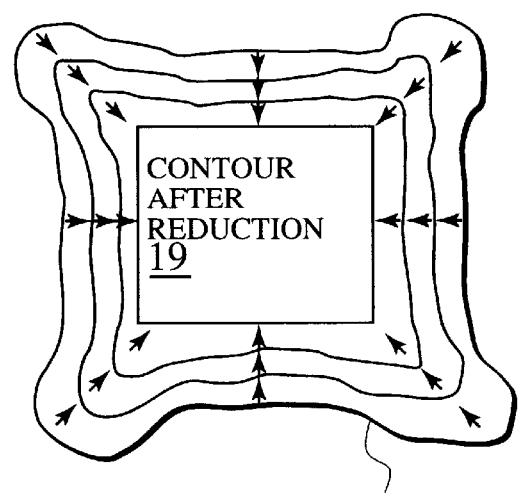
FIG. 24 is a view showing a process for generating a standard figure from a contour of a fine pattern.

FIG. 24 shows the condition that the repetition of the reduction process enables the generation from the contour 16 of the fine pattern to the contour 19 after the reduction. Since the dilation process is repeatedly performed on the contour 19 after the reduction, the correction pattern region is removed from the contour of the fine pattern, similarly to the removal of the convex shape. Thus, it is possible to generate the standard figure corresponding to the non-corrected fine pattern.

As mentioned above, it should be understood that this embodiment includes various variations and the like which are not noted here. Thus, the present invention is limited only by the invention specification items according to the reasonable claims from this disclosure.

Second Embodiment

A program to attain the method for measuring the fine pattern, which is illustrated in the first embodiment and the variations thereof, can be stored in a record medium that can be read by a computer. The method for measuring the fine pattern can be attained by reading the record medium into the database 33 shown in FIG. 2, and then controlling so as to execute the various image process functions in the image processor 31 from the program, in accordance with a pre-determined procedure. Here, the record medium contains, for example, a semiconductor memory, such as ROM, RAM and the like, and a memory medium that can record therein a program, such as a magnetic disc, an optical disc, a magnetic tape and the like.

Figure 25:
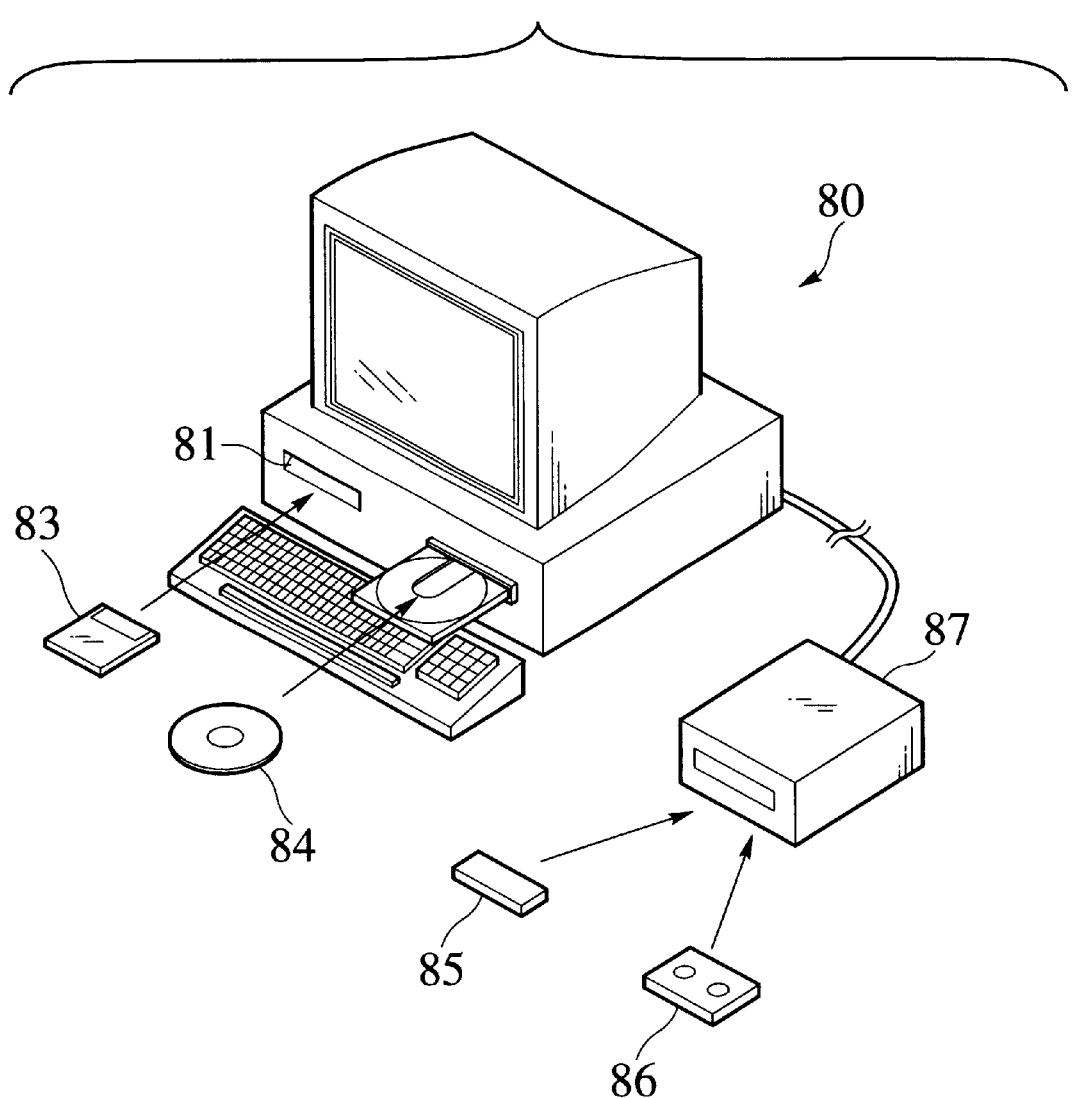
FIG. 25 is a schematically perspective view showing a computer system for executing a program to measure a fine pattern according to a second embodiment of the present invention.

FIG. 25 is an appearance view showing an example of a computer system 80 which reads the program stored in the record media, and then attaining the method for measuring the fine pattern, in accordance with a procedure described in the program. Then, a floppy disc drive 81 and a CD-ROM drive 82 are mounted on a front surface of a body of the computer system 80. The program stored in the record media can be installed within the system by inserting a floppy disc 83 serving as the magnetic disc, or a CD-ROM 84 serving as the optical disc from respective drive inlets, and then carrying out a predetermined reading operation. Also, a connection of a predetermined drive device 87 enables the usage of a ROM 85 serving as the semiconductor memory used in, for example, a game pack and the like, and a cassette tape 86 serving as the magnetic tape.

What is claimed is:

1. A method for measuring a fine pattern, comprising:
    a first step of capturing an image of a fine pattern;
    a second step of extracting a contour of the fine pattern from the image;
    a third step of capturing a standard figure of the fine pattern;
    a fourth step of superimposing the standard figure on the contour by enlarging or reducing the standard figure while maintaining an aspect ratio thereof in order to fit the standard figure into the contour;
    a fifth step of extracting an intersection of the contour and the standard figure;
    a sixth step of extracting a differential region surrounded by the contour, the standard figure and the intersection;
    a seventh step of extracting a correction pattern region from the differential region, comprising:
        a process for indicating the differential region in a polar coordinate;
        a process for preparing a weighting function having a weight in an existence range of a correction pattern;
        a process for multiplying the differential region by the weighting function; and
        a process for extracting as the correction pattern region the differential region after it is multiplied by the weighting function; and
    an eighth step of measuring the correction pattern region.

2. The method of claim 1, wherein the process for preparing the weighting function comprises:
    an operation for determining a difference between a design pattern after a correction and the standard figure, and extracting the correction pattern;
    an operation for extracting a center of gravity in the standard figure;
    an operation for indicating the correction pattern in a polar coordinate with the center of gravity as an original point; and
    an operation for calculating a weighting function in which an existence range of the correction pattern is assumed to be 1 and a non-existence range of the correction pattern is assumed to be 0 from the correction pattern.

3. The method of claim 1, wherein the process for preparing the weighting function comprises:
    an operation for indicating the contour in a polar coordinate with a center of gravity in the standard figure superimposed at the fourth step as an original point;
    an operation for carrying out a frequency analysis, and removing a high frequency component of the contour;
    an operation for carrying out a frequency analysis, and extracting an existence range of the correction pattern from a low frequency component of the contour; and
    an operation for preparing a weighting function in which the existence range of the correction pattern is assumed to be 1 and a non-existence range of the correction pattern is assumed to be 0.

4. The method of claim 1, wherein the fourth step comprises:

a process for indicating the contour in a polar coordinate;

a process for indicating the standard figure in a polar coordinate;

a process for preparing a weighting function having a weight in a non-existence range of the correction pattern;

a process for multiplying the contour by the weighting function;

a process for multiplying the standard figure by the weighting function;

a process for approximating the standard figure to the contour; and a process for indicating the contour and the standard figure in an orthogonal coordinate.

5. The method of claim 4, wherein the process for preparing the weighting function comprises:

an operation for determining a difference between a design pattern after a correction and the standard figure, and extracting the correction pattern;

an operation for extracting a center of gravity in the standard figure;

an operation for indicating the correction pattern in a polar coordinate with the center of gravity in the standard figure as an original point; and an operation for calculating a weighting function in which the existence range of the correction pattern is assumed to be 1 and the non-existence range of the correction pattern is assumed to be 0 from the correction pattern.

6. The method of claim 4, wherein the process for preparing the weighting function comprises:

an operation for indicating the contour in a polar coordinate;

an operation for carrying out a frequency analysis, and removing a high frequency component of the contour;

an operation for carrying out a frequency analysis, and extracting as the existence range of the correction pattern from a low frequency component of the contour; and an operation for preparing a weighting function in which the existence range of the correction pattern is assumed to be 0 and the non-existence range of the correction pattern is assumed to be 1.

7. The method of claim 1, wherein the fourth step in a case that the fine pattern is a pattern which is not a closed region comprises:

a process for extracting a middle point between any two points in a portion corresponding to a non-corrected portion, on left and right contours extracted from the fine pattern; and a process for generating two parallel lines positioned at a distance equal to half of a line width from the middle point, as the standard figure.

8. A method for measuring a fine pattern, comprising:

a first step of capturing an image of a fine pattern;

a second step of extracting a contour of the fine pattern from the image;

a third step of capturing a standard figure of the fine pattern;

a fourth step of superimposing the standard figure on the contour by enlarging or reducing the standard figure while maintaining an aspect ratio thereof in order to fit the standard figure into the contour;

a fifth step of extracting an intersection of the contour and the standard figure;

a sixth step of extracting a differential region surrounded by the contour, the standard figure and the intersection;

a seventh step of comparing the number of the differential region with the number of correction pattern added to the standard figure;

an eighth step of measuring an area of the differential region;

a ninth step of extracting a correction pattern region from the differential region, wherein:

if the number of the differential region is equal to the number of the correction pattern, the ninth step is a step of extracting all the differential region as the correction pattern region;

if the number of the differential region is greater than the number of the correction pattern, and if two blocks are generated at a predetermined interval in a distribution of the area, the ninth step is a step of extracting the differential region having an area equal to or wider than a predetermined threshold as the correction pattern region; and if the number of the differential region is greater than the number of the correction pattern, and if two blocks are not generated at a predetermined interval in a distribution of the area, the ninth step comprises:

a process for indicating the differential region in a polar coordinate;

a process for preparing a weighting function having a weight in an existence range of the correction pattern;

a process for multiplying the differential region indicated in the polar coordinate by the weighting function; and a process for extracting as the correction pattern region the differential region after it is multiplied by the weighting function; and an tenth step of measuring the correction pattern region.

9. The method of claim 8, wherein the process for preparing the weighting function comprises:

an operation for determining a difference between a design pattern after a correction and the standard figure, and extracting the correction pattern;

an operation for extracting a center of gravity in the standard figure;

an operation for indicating the correction pattern in a polar coordinate with the center of gravity as an original point; and an operation for calculating a weighting function in which an existence range of the correction pattern is assumed to be 1 and a non-existence range of the correction pattern is assumed to be 0 from the correction pattern.

10. The method of claim 8, wherein the process for preparing the weighting function comprises:

an operation for indicating the contour in a polar coordinate with a center of gravity in the standard figure superimposed at the fourth step as an original point;

an operation for carrying out a frequency analysis, and removing a high frequency component of the contour;

an operation for carrying out a frequency analysis, and extracting an existence range of the correction pattern from a low frequency component of the contour; and an operation for preparing a weighting function in which the existence range of the correction pattern is assumed to be 1 and a non-existence range of the correction pattern is assumed to be 0.

11. An apparatus for measuring a fine pattern, comprising:
a photographing device configured to obtain an image of a fine pattern;
a memory configured to store therein a pattern data of a standard figure of the fine pattern; and
an image processor comprising:
- a device configured to extract a contour of the fine pattern from the image;
- a device configured to superimpose the standard figure on the contour;
- a device configured to extract an intersection of the standard figure and the contour;
- a device configured to extract a differential region surrounded by the standard figure, the contour and the intersection;
- a device configured to extract a correction pattern region from the differential region, comprising:
  - a unit configured to indicate the differential region in a polar coordinate;
  - a unit configured to prepare a weighting function having a weight in an existence range of a correction pattern;
  - a unit configured to multiply the differential region by the weighting function; and
  - a unit configured to extract as the correction pattern region the differential region after it is multiplied by the weighting function; and
- a device configured to measure the correction pattern region.

12. A record medium that can be read by a computer which stores therein a program for measuring a fine pattern, the program comprising:
a first step of capturing an image of a fine pattern;
a second step of extracting a contour of the fine pattern from the image;
a third step of capturing a standard figure of the fine pattern;
a fourth step of superimposing the standard figure on the contour by enlarging or reducing the standard figure while maintaining an aspect ratio thereof in order to fit the standard figure into the contour;
a fifth step of extracting an intersection of the contour and the standard figure;
a sixth step of extracting a differential region surrounded by the contour, the standard figure and the intersection;
a seventh step of extracting a correction pattern region from the differential region, comprising:
- a process for indicating the differential region in a polar coordinate;
- a process for preparing a weighting function having a weight in an existence range of a correction pattern;
- a process for multiplying the differential region by the weighting function; and
- a process for extracting as the correction pattern region the differential region after it is multiplied by the weighting function; and
an eighth step of measuring the correction pattern region.

13. An apparatus for measuring a fine pattern, comprising:
a photographing device configured to obtain an image of a fine pattern;
a memory configured to store therein a pattern data of a standard figure of the fine pattern; and
an image processor comprising:
- a device configured to extract a contour of the fine pattern from the image;
- a device configured to superimpose the standard figure on the contour;
- a device configured to extract an intersection of the standard figure and the contour;
- a device configured to extract a differential region surrounded by the standard figure, the contour and the intersection;
- a device configured to compare the number of the differential region with the number of correction pattern added to the standard figure;
- a device configured to measure an area of the differential region;
- a device configured to extract a correction pattern region from the differential region, wherein:
  - if the number of the differential region is equal to the number of the correction pattern, the device extracts all the differential region as the correction pattern region;
  - if the number of the differential region is greater than the number of the correction pattern, and if two blocks are generated at a predetermined interval in a distribution of the area, the device extracts the differential region having an area equal to or wider than a predetermined threshold as the correction pattern region; and
  - if the number of the differential region is greater than the number of the correction pattern, and if two blocks are not generated at a predetermined interval in a distribution of the area, the device comprises:
    - a unit configured to indicate the differential region in a polar coordinate;
    - a unit configured to prepare a weighting function having a weight in an existence range of the correction pattern;
    - a unit configured to multiply the differential region indicated in the polar coordinate by the weighting function; and
    - a unit configured to extract as the correction pattern region the differential region after it is multiplied by the weighting function; and
- a device configured to measure the correction pattern region.

14. A record medium that can be read by a computer which stores therein a program for measuring a fine pattern, the program comprising:
a first step of capturing an image of a fine pattern;
a second step of extracting a contour of the fine pattern from the image;
a third step of capturing a standard figure of the fine pattern;
a fourth step of superimposing the standard figure on the contour by enlarging or reducing the standard figure while maintaining an aspect ratio thereof in order to fit the standard figure into the contour;
a fifth step of extracting an intersection of the contour and the standard figure;
a sixth step of extracting a differential region surrounded by the contour, the standard figure and the intersection;
a seventh step of comparing the number of the differential region with the number of correction pattern added to the standard figure;
an eighth step of measuring an area of the differential region;
a ninth step of extracting a correction pattern region from the differential region, wherein:

if the number of the differential region is equal to the number of the correction pattern, the ninth step is a step of extracting all the differential region as the correction pattern region;

if the number of the differential region is greater than the number of the correction pattern, and if two blocks are generated at a predetermined interval in a distribution of the area, the ninth step is a step of extracting the differential region having an area equal to or wider than a predetermined threshold as the correction pattern region; and if the number of the differential region is greater than the number of the correction pattern, and if two blocks are not generated at a predetermined interval in a distribution of the area, the ninth step comprises:

a process for indicating the differential region in a polar coordinate;

a process for preparing a weighting function having a weight in an existence range of the correction pattern;

a process for multiplying the differential region indicated in the polar coordinate by the weighting function; and a process for extracting as the correction pattern region the differential region after it is multiplied by the weighting function; and a tenth step of measuring the correction pattern region.

* * * * *